US012598759B2

(12) United States Patent
Frougier et al.

(10) Patent No.: US 12,598,759 B2
(45) Date of Patent: Apr. 7, 2026

(54) HIGH-DENSITY METAL-INSULATOR-METAL CAPACITOR INTEGRATION WTH NANOSHEET STACK TECHNOLOGY

(71) Applicant: International Business Machines Corporation, Armonk, NY (US)

(72) Inventors: Julien Frougier, Albany, NY (US); Ruilong Xie, Niskayuna, NY (US); Veeraraghavan S. Basker, Schenectady, NY (US); Andrew Gaul, Halfmoon, NY (US)

(73) Assignee: International Business Machines Corporation, Armonk, NY (US)

( * ) Notice: Subject to any disclaimer, the term of this patent is extended or adjusted under 35 U.S.C. 154(b) by 903 days.

(21) Appl. No.: 17/457,667

(22) Filed: Dec. 5, 2021

(65) Prior Publication Data
US 2023/0178587 A1     Jun. 8, 2023

(51) Int. Cl.
*H10D 1/00*     (2025.01)
*H10D 1/68*     (2025.01)

(52) U.S. Cl.
CPC ............. *H10D 1/042* (2025.01); *H10D 1/714* (2025.01); *H10D 1/716* (2025.01)

(58) Field of Classification Search
CPC ........ H10D 1/714; H10D 1/716; H10D 1/042; H10D 1/043
See application file for complete search history.

(56) References Cited

U.S. PATENT DOCUMENTS 6,894,331 B2     5/2005   Yoshitomi
8,178,404 B2     5/2012   Olewine
(Continued)

FOREIGN PATENT DOCUMENTS

CN     107746055 A     3/2018
CN     108565335 A     9/2018
(Continued)

OTHER PUBLICATIONS

International Searching Authority, "Notification of Transmittal of the International Search Report and the Written Opinion of the International Searching Authority, or the Declaration", International application No. PCT/EP2022/081842, International Filing Date Nov. 14, 2022, Mailed on Feb. 17, 2023, 12 pages.
(Continued)

*Primary Examiner* — Jose R Diaz
(74) *Attorney, Agent, or Firm* — Aaron N. Pontikos

(57)     ABSTRACT
An approach provides a metal-insulator-metal capacitor with a comb-like structure. The metal-insulator-metal capacitor includes a first electrode material forming a central, vertical portion of the first electrode metal and two sets of stacked horizontal portions of the first electrode metal. An insulator material surrounds the first electrode metal and exposes a top surface of the central, vertical portion of the first electrode metal. The metal-insulator-metal capacitor includes a second electrode material surrounding the insulator material. The metal-insulator-metal capacitor includes a first electrode contact connecting to the top surface of the central, vertical portion of the first electrode metal and a second electrode contact connecting to a top surface of the second electrode material.

19 Claims, 20 Drawing Sheets

(56) References Cited

U.S. PATENT DOCUMENTS

| | | | |
|---|---|---|---|
| 8,424,177 | B2 | 4/2013 | Farcy |
| 9,570,575 | B1 * | 2/2017 | Balakrishnan .... H01L 21/02532 |
| 9,991,334 | B2 | 6/2018 | Bi |
| 10,032,856 | B1 | 7/2018 | Bao |
| 10,090,307 | B2 * | 10/2018 | Balakrishnan ....... H10D 30/797 |
| 10,157,935 | B2 | 12/2018 | Cheng |
| 10,170,548 | B2 | 1/2019 | Cheng |
| 10,319,717 | B2 | 6/2019 | Bi |
| 10,692,772 | B2 | 6/2020 | Cheng |
| 10,734,473 | B2 | 8/2020 | Cheng |
| 2017/0092975 | A1 | 3/2017 | Kim |
| 2019/0312028 | A1 | 10/2019 | Park |
| 2021/0013143 | A1 | 1/2021 | Lu |
| 2021/0013302 | A1 | 1/2021 | Lu |

FOREIGN PATENT DOCUMENTS

| | | | |
|---|---|---|---|
| EP | 4442095 | A1 | 10/2024 |
| JP | 4689302 | B2 | 5/2011 |
| JP | 2011181726 | A | 9/2011 |
| JP | 2024-542384 | A | 11/2024 |
| KR | 20170037533 | A | 4/2017 |
| KR | 20180096098 | A | 8/2018 |
| WO | 2011043613 | A2 | 4/2011 |
| WO | 2023/099189 | A1 | 6/2023 |

OTHER PUBLICATIONS

European Patent Office, "EP Examination Report", Oct. 15, 2025, 08 pages, EP Application No. 22817262.3.

* cited by examiner

HIGH-DENSITY METAL-INSULATOR-METAL CAPACITOR INTEGRATION WTH NANOSHEET STACK TECHNOLOGY

BACKGROUND OF THE INVENTION

The present invention relates generally to the field of semiconductor device formation using nanosheet stacks to form a metal-insulator-metal (MIM) capacitor and more particularly to form the MIM capacitor in the front end of the liner (FEOL) using nanosheet architecture and processes.

A typical metal-insulator-metal (MIM) capacitor is formed by two parallel metal layers that have a high k-dielectric between them. In general, capacitors are important for energy storage, signal filtering, and high-frequency tuning applications. MIM capacitors are a basic building block of electronic systems and on-chip capacitors are a critical element in analog, mixed-signal application-specific integrated circuits (ASIC), and radio frequency complementary-metal-oxide semiconductor (CMOS) designs. Typically, MIM capacitors are widely used in high-performance microprocessor design for on-chip decoupling functions to help mitigate the power supply noise problem. Factors impacting the performance of the MIM capacitor include for instance the k-value and thickness of the insulator, the type of metal for the electrodes to optimize the pairing with a given insulator, and total MIM capacitor area. In general, increasing the MIM capacitor footprint to increase MIM capacitor performance is not desired.

SUMMARY

Embodiments of the present invention disclose a metal-insulator-metal capacitor with a comb-like structure. The metal-insulator-metal capacitor includes a first electrode material forming a central, vertical portion of the first electrode metal and one or more sets of stacked horizontal portions of the first electrode metal. An insulator material surrounds the first electrode metal except for a top surface of the central, vertical element of the first electrode metal that is uncovered by the insulator material. The metal-insulator-metal capacitor includes a second electrode metal surrounding the insulator material. The insulator electrically isolates the first electrode metal with the comb-like structure from the second electrode metal in the metal-insulator-metal capacitor. The metal-insulator-metal capacitor includes a first electrode contact connecting to the top surface of the central, vertical portion of the first electrode metal and a second electrode contact connecting to a top surface of the second electrode material.

Embodiments of the present invention provide a method of forming a metal-insulator-metal capacitor with a comb-like structure. The method includes forming a sacrificial gate over a gate dielectric material on one or more nanosheet stacks. The method includes removing the sacrificial gate and removing the layers of the suspension material in each of the nanosheet stacks. The method includes depositing a metal gate material over the gate dielectric and a plurality of channel nanosheet layers in the nanosheet stacks. The method includes forming a vertical, metal-insulator-metal (MIM) capacitor opening between each of the nanosheet stacks. The method of forming the vertical, MIM opening includes etching the outside edges of the nanosheet stacks between adjacent nanosheet stacks. Additionally, the method includes removing the plurality of channel nanosheet layers in the nanosheet stacks and removing exposed portions of the gate dielectric material. The method includes depositing a dielectric material for a MIM capacitor insulator. The dielectric material for the MIM capacitor insulator is conformally deposited inside the MIM capacitor opening and in the plurality of thin, horizontal openings where the channel nanosheet layers were removed. The method also includes depositing a first electrode metal over the dielectric material in the MIM capacitor vertical opening and in the plurality of horizontal openings where the plurality of channel nanosheet layers were removed. The method includes forming a first electrode contact on a top surface of the center of the first electrode metal and forming a second electrode contact to a top surface of the gate metal on one or both sides first electrode contact.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1A:
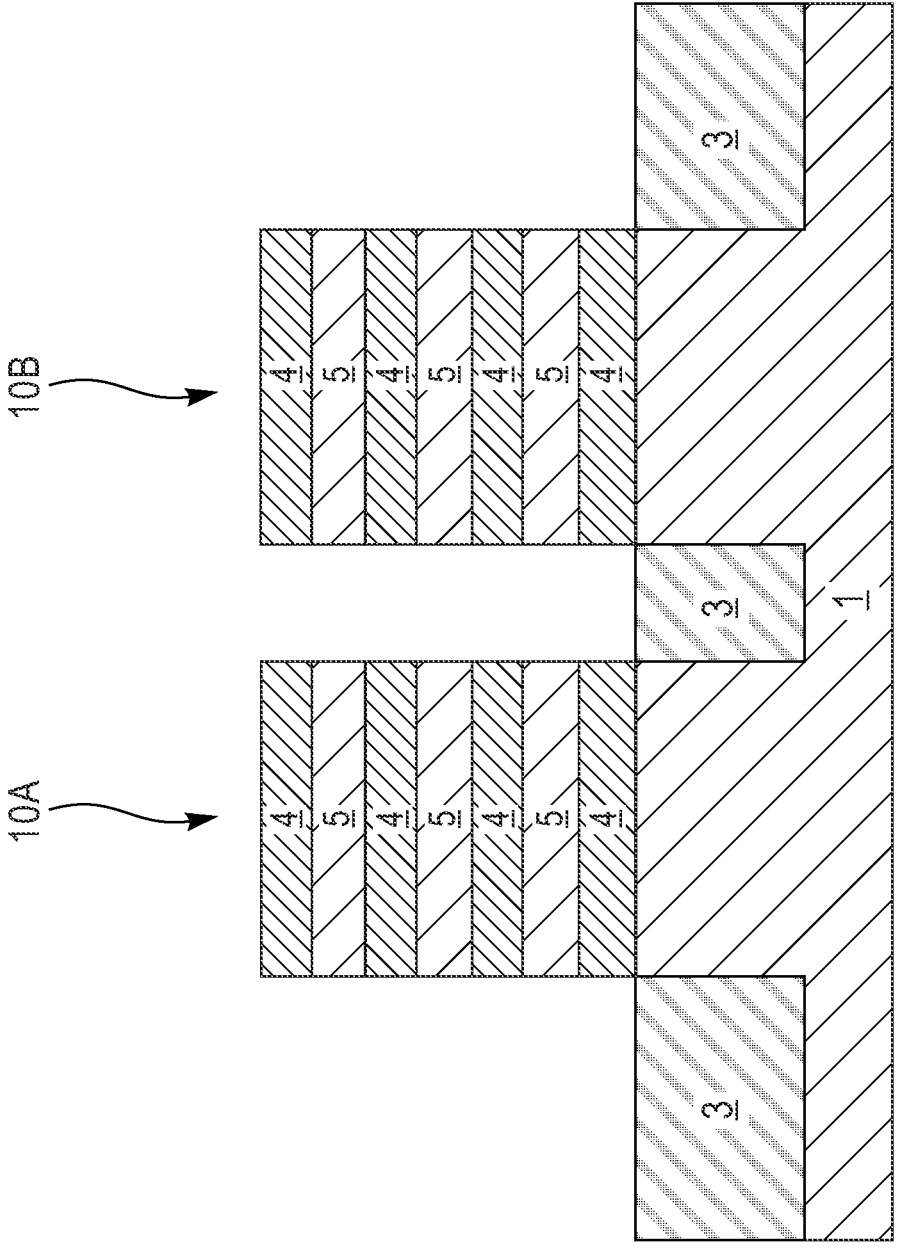
FIG. 1A depicts a cross-sectional view of a semiconductor structure after forming two nanosheet stacks, in accordance with an embodiment of the present invention.

Embodiments of the present invention recognize increasing system performance requirements, driven at least in part by the increasing use of artificial intelligence, which continues to drive tighter pitches in semiconductor devices and smaller semiconductor chips. Embodiments of the present invention recognize that in various electronic systems and computer applications, capacitors are important for energy storage, signal filtering, especially in high-frequency tuning applications. Embodiments of the present invention recognize that current capacitor technologies such as polysilicon-insulator-polysilicon (PIP) capacitors and metal-oxide-semiconductor (MOS) devices exhibit depletion effects and associated parasitic capacitance that causes undesirable capacitance variations and voltage bias fluctuations. Similarly, using capacitor plates causes high resistivity that generates excessive capacitance loss to the substrate. This results in poor quality factor (Q) in high-frequency applications. For these reasons, embodiments of the present invention recognize that a new MIM capacitor structure providing better capacitor for improved performance would be desirable, especially, a high-density, cost-effective MIM capacitor that requires few additional semiconductor processing steps.

Embodiments of the present invention recognize that metal-insulator-metal (MIM) capacitors are one of the key building blocks in high-performance CMOS, analog, mixed-signal, and radio frequency CMOS (RFCMOS) circuits. Conventional metal-insulator-metal (MIM) capacitors are formed with two parallel metal layers that have an insulator separating the two parallel metal layers.

Embodiments of the present invention recognize increasing MIM capacitor capacitance density is desirable to improving system and/or semiconductor chip performance. MIM capacitor attributes that provide an opportunity to improve capacitance density and to reduce the chip space utilized by MIM capacitors include implementing an insulator with a higher dielectric constant in the MIM capacitor, creating shorter distances between metal layers of the MIM capacitor, and increasing the MIM capacitor area. Embodiments of the present invention recognize that a cost-effective method of forming high-density MIM capacitors using high-k dielectric constant materials for the insulator between the metal is desirable. Additionally, it is recognized that nanosheet (NS) transistors are being pursued as a viable device architecture for scaling CMOS devices in advanced technologies beyond the three nm node.

Embodiments of the present invention provide a MIM capacitor semiconductor structure formed using nanosheet stacks to create a cost-effective, high-density MIM capacitor in the Front-End-Of-the-Line (FEOL). Embodiments of the present invention disclose a comb-like, a high-density MIM capacitor that is formed using nanosheet stacked structures. The nanosheet structures forming the comb-like, high-density MIM capacitor can be formed in conjunction with the logic devices using conventional FEOL semiconductor processes in embodiments of the present invention. Using nanosheet structures to form the comb-like MIM capacitor disclosed herein can provide a cost-effective, high-density MIM capacitor. Embodiments of the present invention replace the thin, channel nanosheet layers of the nanosheet stack with an electrode metal material that is inside a gate metal material. The electrode metal is insulated by a high-k dielectric material to electrically isolate the electrode metal from the gate metal which is a second electrode metal to form the MIM capacitor.

Embodiments of the present invention disclose a three-dimensional, comb-like MIM capacitor structure. The three-dimensional, comb-like structure provides a high-density MIM capacitor that can be formed in the FEOL simultaneously with one or more logic devices or independently from FEOL logic devices. Embodiments of the present invention provide the three-dimensional comb-like structure with the comb-like portion of the MIM capacitor formed by a first electrode material filling a vertical MIM capacitor opening, and a number of thin, horizontal openings formed after the channel nanosheet layers are removed. The first electrode metal may form one or more central, vertical portions of the comb-like MIM capacitor. The first electrode metal also forms a number of flat, horizontal plate-like structures extending from one or both sides of the central, vertical portion of the first electrode metal. The flat, horizontal plate-like structures are vertically stacked (e.g., each of the vertically, stacked horizontal and vertically aligned plate-like structures can be considered a set of stacked horizontal plates). As used herein, a set is more than one element or a group of related elements, such as a group of vertically stacked horizontal portions of a material.

Embodiments of the present invention include an insulator material that covers the sides and bottom portion of the first electrode metal. The insulator material electrically isolates the first electrode metal from a gate metal acting as the second electrode of the comb-like MIM capacitor. Another layer of the same or a different dielectric material as the insulator surrounds the bottom and sides of the gate metal. The insulator material is composed of one or more layers of a dielectric material. In various embodiments, the insulator is composed of at least one layer of a high-k dielectric material.

Embodiments of the present invention provide a rectangular-shaped gate metal with a sidewall spacer where the gate metal either completely covers the stacked horizontal plate-like portions of the first electrode metal or covers the center portion of the first electrode material leaving an inner spacer to cover the outside edges of stacked horizontal plate-like portions of the first electrode metal. Embodiments of the present invention include electrode contacts that each connect to the top surface of the central, vertical portion of the first electrode metal or to the top surface of the gate metal that is above a stacked horizontal portion of the first electrode metal.

Furthermore, embodiments of the present invention disclose using multiple nanosheet stacks to form multiple central, vertical portions of the first electrode metal connecting that each connect to two sets of stacked horizontal plate-like portions of the first electrode metal. Embodiments of the present invention providing multiple central, vertical portions of the first electrode and multiple sets of stacked horizontal plate-like portions of the first electrode include one or more insulator materials separating the first electrode metal from the gate material. In these embodiments, multiple electrode contacts connect to a top surface of either the central, vertical portion of the first electrode metal or to the gate metal.

Embodiments of the present invention provide a method of forming the MIM capacitor with a comb-like structure that uses one or more nanosheet stacks on a semiconductor substrate where a gate dielectric and a sacrificial gate are formed over the nanosheet stacks. The method includes removing the sacrificial gate and the suspension layers (e.g., composed of silicon germanium) from the nanosheet stacks. The method includes depositing a gate dielectric around the remaining channel layers and on the sidewall spacer. The method includes depositing a gate metal over the gate dielectric.

A vertical, MIM capacitor opening is formed between adjacent nanosheet stacks on a shallow isolation trench. The etching process forming the MIM capacitor opening also removes the outside edges of the adjacent nanosheet stacks as a part of the MIM capacitor opening. The method includes removing exposed portions of the gate dielectric surrounding the MIM opening, on the channel nanosheet layers, and the channel nanosheet layers remaining in the nanosheet stacks.

The method includes depositing at least one layer of an insulator material inside the MIM opening and where the gate dielectric material previously resided on the gate metal. The first electrode metal can be conformally deposited over the insulator material (e.g., inside the MIM opening and the horizontal openings created by the removal of the channel nanosheet layers). The gate metal forms a second electrode of the comb-like MIM capacitor that is separated from the first electrode material by the insulator. Using known damascene processes, the method includes forming electrode contacts over the top surface of the central, vertical portion of the first electrode metal and on the top surface of the gate metal on either or both sides of the central, vertical portion of the first electrode metal.

In yet another embodiment of the present invention, a MIM capacitor is formed from one or more nanosheet stacks with a sacrificial gate that covers only a center portion of each of the nanosheet stacks. In this embodiment, the outer edges of the nanosheet stack are not covered by the sacrificial gate along the long edge of the nanosheet stacks. The MIM capacitor formed from this initial structure includes inner spacers formed from the outer edges of the suspension material in the nanosheet stack under the sidewall spacer. The MIM capacitor in this case has the sets of vertically stacked horizontal portions of the first electrode metal where the outside edges of the horizontal portions of the first electrode metal are separated by inner spacers.

Embodiments of the present invention provide a method of forming the MIM capacitors using one or more nanosheet stacks that are formed simultaneously with one or more logic devices or memory devices in another region of the semiconductor substrate. In these embodiments, the semiconductor processes and materials forming the logic devices also form the comb-like MIM capacitor on the same semiconductor substrate or wafer.

The following description with reference to the accompanying drawings is provided to assist in a comprehensive understanding of exemplary embodiments of the invention as defined by the claims and their equivalents. The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the industry, or to enable others of ordinary skill in the art to understand the embodiments disclosed herein. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings but are merely used to enable a clear and consistent understanding of the invention. Accordingly, it should be apparent to those skilled in the art that the following description of exemplary embodiments of the present invention is provided for illustration only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layers at the interface of the two elements.

In the interest of not obscuring the presentation of embodiments of the present invention, in the following detailed description, some processing steps or operations that are known in the art may have been combined for presentation and illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing integrated circuits on semiconductor chips. The methods described herein can be used in the fabrication of integrated circuit chips or semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The figures represent cross-section portions of a semiconductor chip or a substrate, such as a semiconductor wafer during fabrication, and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described. It will be understood that, although the terms first, second, etc. can be used herein to describe various elements, these elements should not be limited by these terms. These terms are only used to distinguish one element from another element. Thus, the first element discussed below could be termed a second element without departing from the scope of the present concept.

Deposition processes for the metal materials and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of a chemical reaction between gaseous reactants at greater than room temperature (e.g., from about 25 C to about 900 C.). The solid product of the reaction is deposited on the surface on which a film, coating, or layer of the solid product is to be formed. Variations of CVD processes include, but are not limited to, atmospheric pressure CVD (APCVD), low-pressure CVD (LPCVD), plasma-enhanced CVD (PECVD), and metal-organic CVD (MOCVD), and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface.

Selectively etching as used herein includes but is not limited to patterning using one of lithography, photolithography, an extreme ultraviolet (EUV) lithography process, or any other known semiconductor patterning process followed by one or more the etching processes. Various materials are referred to herein as being removed or "etched" where etching generally refers to one or more processes implementing the removal of one or more materials while leaving other protected areas of the materials that are masked during the lithography processes unaffected. Some examples of etching processes include but are not limited to the following processes, such as a dry etching process using a reactive ion etch (RIE) or ion beam etch (IBE), a wet chemical etch process, or a combination of these etching processes. A dry etch may be performed using a plasma. Ion milling, sputter etching, or reactive ion etching (RIE) bombards the wafer with energetic ions of noble gases that approach the wafer approximately from one direction, and therefore, these processes are an anisotropic or a directional etching process.

Reference is now made to the figures. The figures provide a schematic cross-sectional illustration of semiconductor devices at intermediate stages of fabrication, according to one or more embodiments of the invention. The device provides schematic representations of the devices of the invention and they are not to be considered accurate or limiting with regards to device element scale.

FIG. 1A depicts the cross-sectional view of nanosheet stack 10A and nanosheet stack 10B, in accordance with an embodiment of the present invention. Nanosheet stack 10A and nanosheet stack 10B are formed using conventional nanosheet stack formation processes including epitaxial growth of alternating layers of semiconductor materials. The alternating semiconductor layers in nanosheet stack 10A and 10B can include nanosheet layers of suspension material 4 that are composed of a semiconductor material, such as a silicon germanium material. As depicted, one layer of suspension material 4 resides on semiconductor substrate 1. The channel nanosheet layers composed of silicon, for example, are labeled channel material 5. Each of nanosheet layer of channel material 5 resides between a layer of suspension material 4 in nanosheet stacks 10A and 10B. After depositing the nanosheet layers, the top layer of suspension material 4 is patterned and the layers of suspension material 4, channel material 5, and top portions of substrate 1 are etched, for example using RIE. STI 3 are formed in the removed portions of substrate 1 as depicted in FIG. 1A.

Semiconductor substrate 1 can be any known semiconductor substrate used in CMOS processing. For example, semiconductor substrate 1 can be composed of a silicon semiconductor material, another group IV semiconductor material (e.g., Ge), a group III-V semiconductor material (e.g., gallium arsenide), a group II-VI semiconductor material, or other known semiconductor material or compounds of any known semiconductor material used in semiconductor circuits where the groups are columns or groups of elements in the Periodic In some embodiments, semiconductor substrate 1 includes one or more of doped, undoped, or contains doped regions, undoped regions, stressed regions, or defect rich regions. In some examples, semiconductor substrate 1 may include one or more other devices or transistors (not depicted). In an embodiment, substrate 10 is one of a layered semiconductor substrate, such as a semiconductor-on-insulator substrate (SOI), Ge on insulator (GeOI), or silicon-on-replacement insulator (SRI). As depicted, three of STI 3 reside in semiconductor substrate 1 adjacent to each of nanosheet stack 10A and nanosheet stack 10B.

Figure 1B:
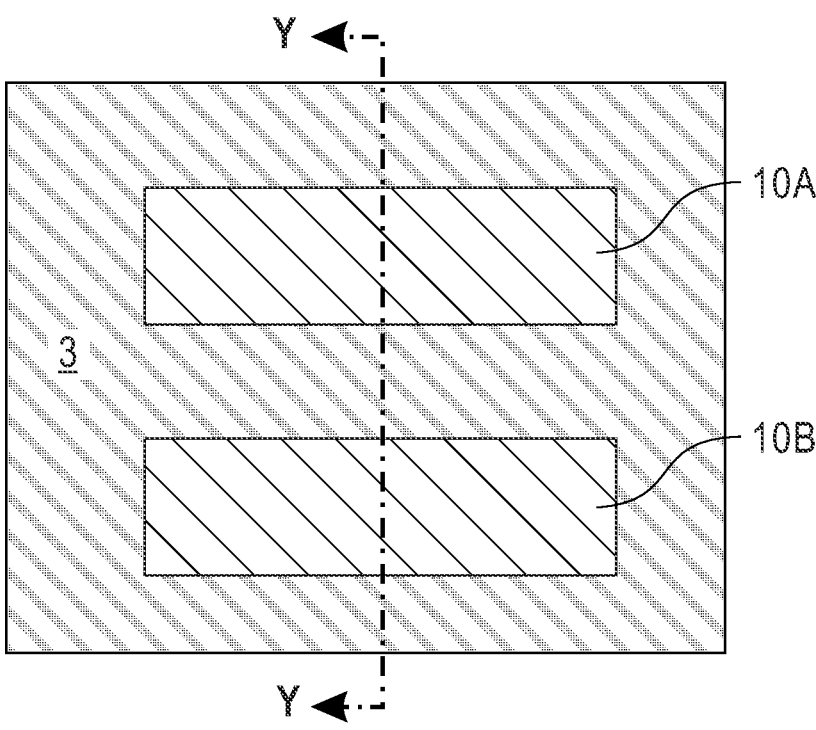
FIG. 1B depicts a top view of a semiconductor structure with the two nanosheet stacks each on a portion of the semiconductor substrate, in accordance with an embodiment of the present invention.

FIG. 1B depicts a top view of the semiconductor structure with nanosheet stack 10A and nanosheet stack 10B on semiconductor substrate 1, in accordance with an embodiment of the present invention. A reference line Y-Y in FIG. 1A illustrates a location and a direction of the cross-sections depicted in FIGS. 1A-FIG. 13.

Figure 2A:
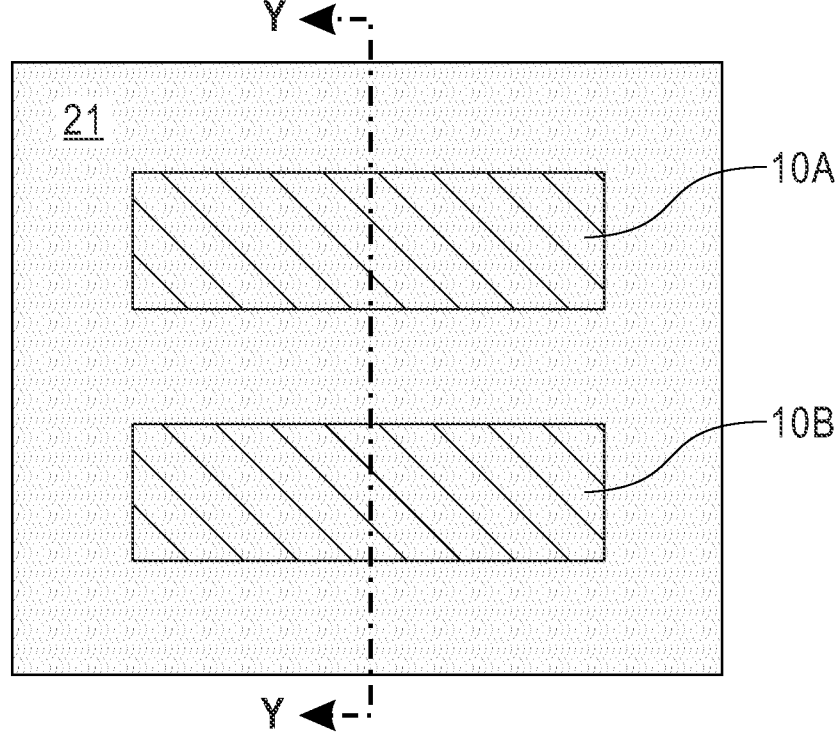
FIG. 2A depicts a top view isometric of the semiconductor structure through a gate hardmask and the sacrificial gate illustrating the two nanosheet stacks under the sacrificial gate, in accordance with an embodiment of the present invention
Figure 2B:
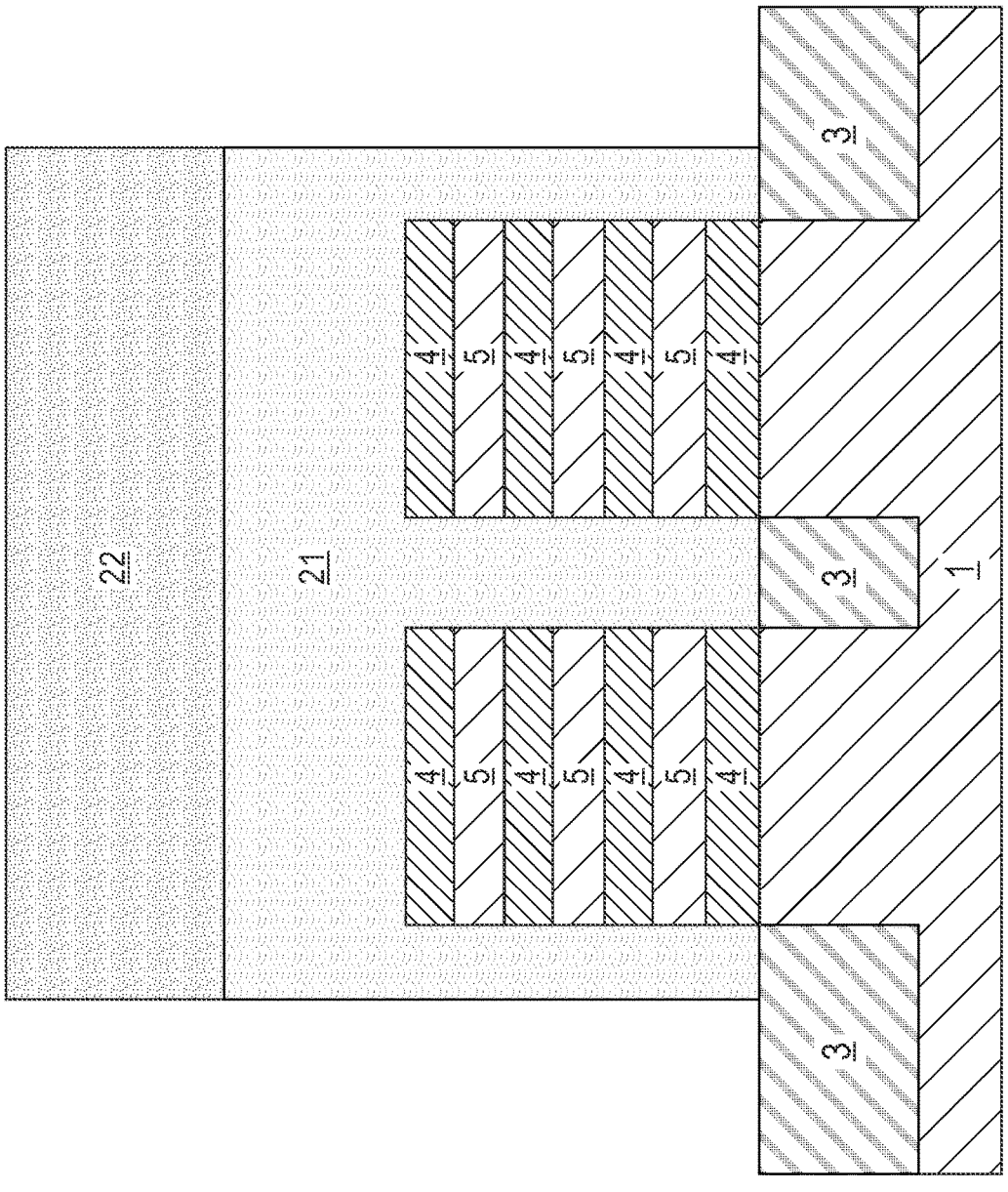
FIG. 2B depicts the cross-section view of the semiconductor structure after forming a sacrificial gate and the gate hardmask, in accordance with an embodiment of the present invention.

FIG. 2A depicts a top view isometric of the semiconductor structure through gate hardmask 22 and sacrificial gate 21 illustrating the location of nanosheet stack 10A and nanosheet stack 10B, in accordance with an embodiment of the present invention. As depicted, FIG. 2B includes sacrificial gate 21 with a view through sacrificial gate hardmask 22 and sacrificial gate 21 to illustrate a location of nanosheet stack 10A and nanosheet stack 10B. In FIG. 2B, the line Y-Y illustrates the location of the cross-sectional views of the semiconductor structure in FIGS. 2B-13.

FIG. 2B depicts a cross-sectional view of the semiconductor structure after forming sacrificial gate 21 and sacrificial gate hardmask 22, in accordance with an embodiment of the present invention. As depicted, FIG. 2 includes the elements of FIG. 1 and sacrificial gate 21 over nanosheet stack 10A, nanosheet stack 10B, and portions of STI 3 adjacent to nanosheet stack 10A and nanosheet stack 10B after sacrificial gate hardmask 22 is deposited over sacrificial gate 21.

Using a deposition process, a layer of sacrificial gate material (e.g., amorphous silicon) is deposited over the semiconductor structure followed by a deposition of a sacrificial gate hardmask 22 (e.g., SiO$_2$, etc.). As depicted, sacrificial gate hardmask 22 is patterned and portions of sacrificial gate hardmask 22 and sacrificial gate 21 are etched. Nanosheet stack 10A and nanosheet stack 10B are composed of alternating layers of suspension material 4 and channel material 5. The etching process exposes each of STI 3 that are adjacent to sacrificial gate 21 covering nanosheet stacks 10A and 10B.

Figure 3:
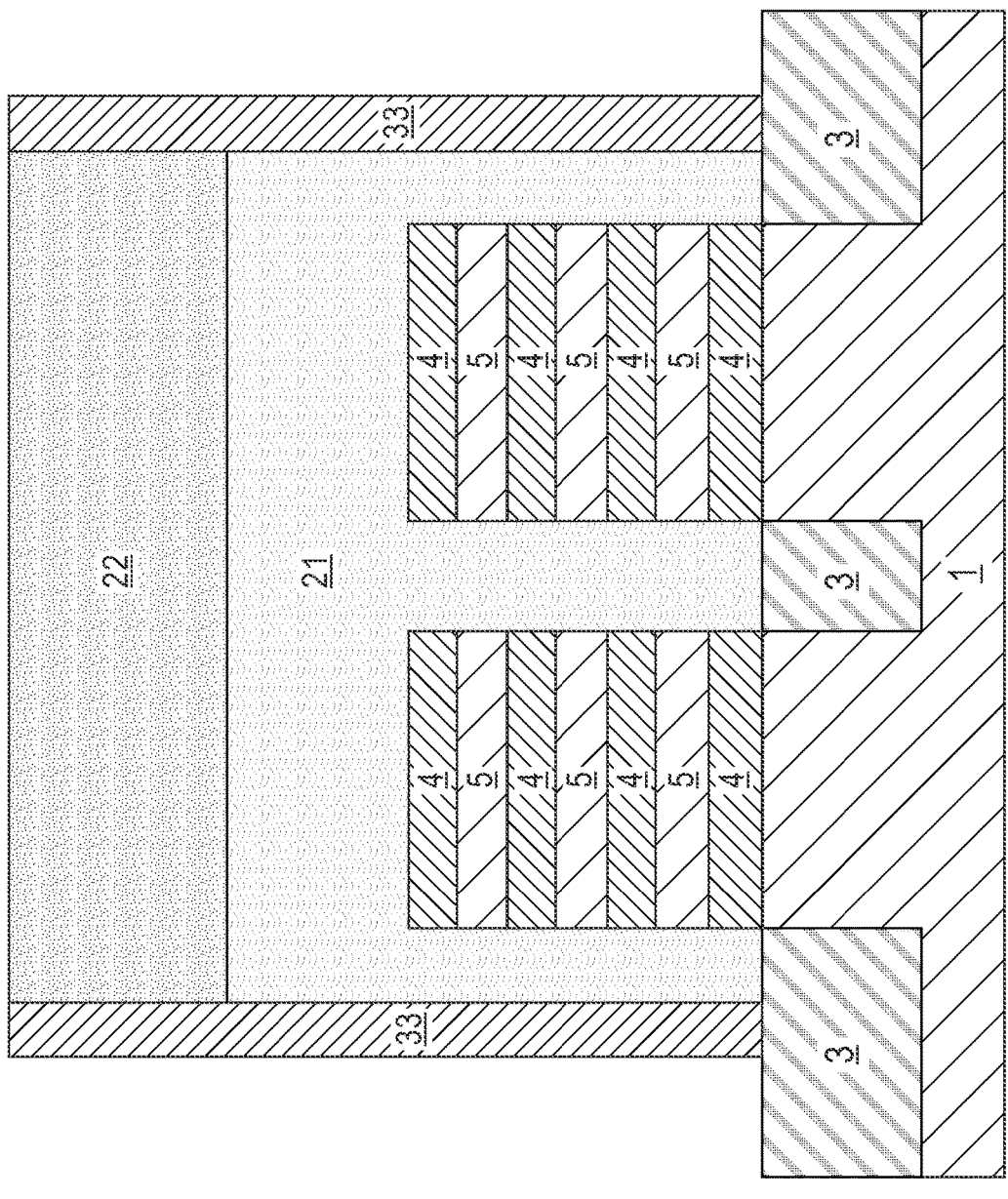
FIG. 3 depicts a cross-sectional view of the semiconductor structure after forming a sidewall spacer, in accordance with an embodiment of the present invention.

FIG. 3 depicts a cross-sectional view of the semiconductor structure after forming spacer 33, in accordance with an embodiment of the present invention. As depicted, FIG. 3 includes the elements of FIG. 2B with spacer 33 surrounding and on exposed side surfaces of sacrificial gate 21 and sacrificial gate hardmask 22. Spacer 33 reside on a portion of two of STI 3.

In various embodiments, spacer 33 is a sidewall spacer deposited using a conformal deposition process, such as but not limited to ALD or CVD. Spacer 33 can be composed of any known sidewall spacer materials used in FET devices. For example, spacer 33 may be composed of a dielectric material. Some examples of the spacer material include, but are not limited to, silicon nitride (SiN), silicon carbide (SiC), silicon oxynitride (SiON), carbon-doped silicon oxide (SiOC), fluorine-doped silicon oxide (SiO:F), silicon-carbon-nitride (SiCN), boron nitride (BN), silicon boron nitride (SiBN), silicoboron carbonitride (SiBCN), silicon oxycabonitride (SiOCN), silicon oxide, and combinations thereof. Spacer 33 can be formed by any suitable techniques such as a deposition process followed by a directional etch. The directional etch may include but is not limited to, a reactive ion etch (RIE).

Figure 4:
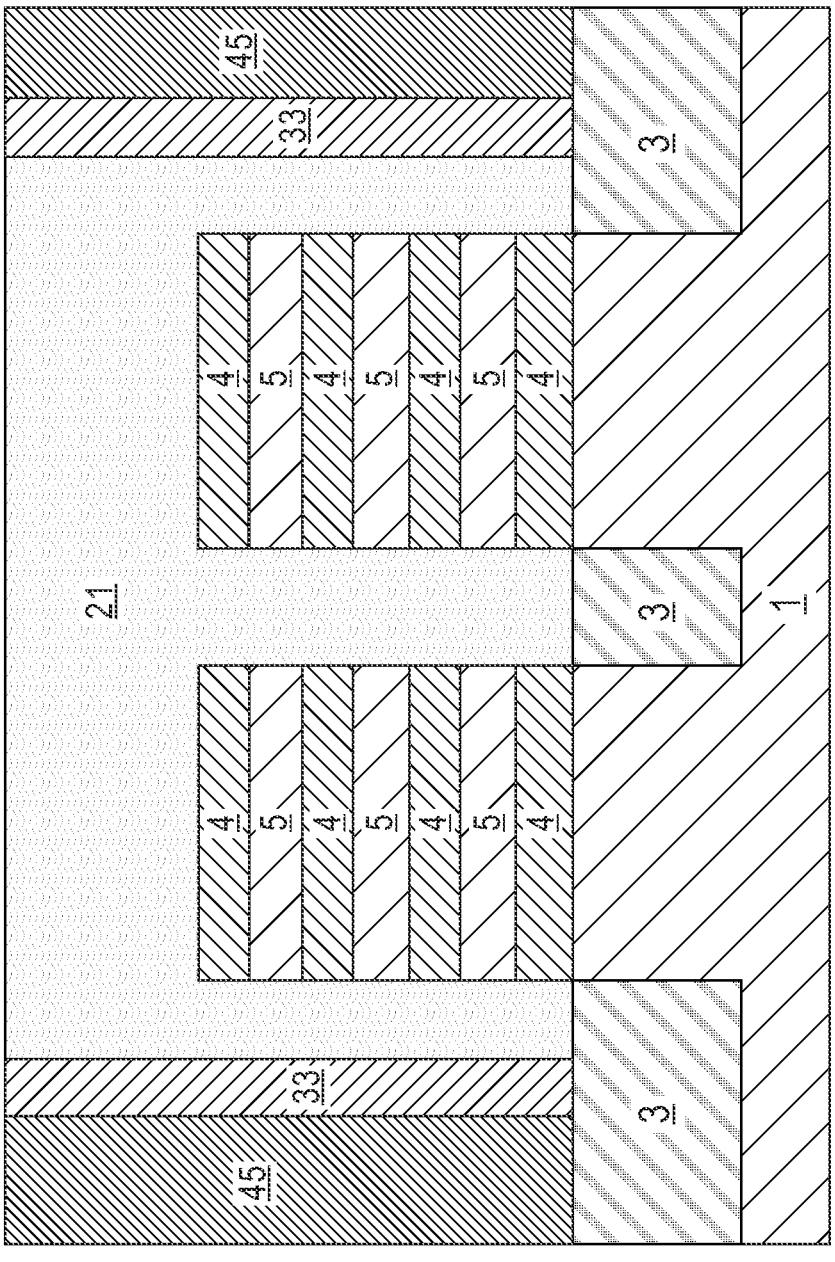
FIG. 4 depicts a cross-sectional view of the semiconductor structure after interlayer dielectric (ILD) fill and chemical mechanical polish (CMP), in accordance with an embodiment of the present invention.

FIG. 4 depicts a cross-sectional view of the semiconductor structure after interlayer dielectric (ILD) 45 fill and chemical mechanical polish (CMP), in accordance with an embodiment of the present invention. As depicted, FIG. 4 includes the elements of FIG. 3 without sacrificial gate hardmask 22 and with ILD 45. ILD 45 is deposited over the semiconductor structure and surrounds spacer 33. The CMP removes the top portion of ILD 45 and sacrificial gate hardmask 22.

Figure 5:
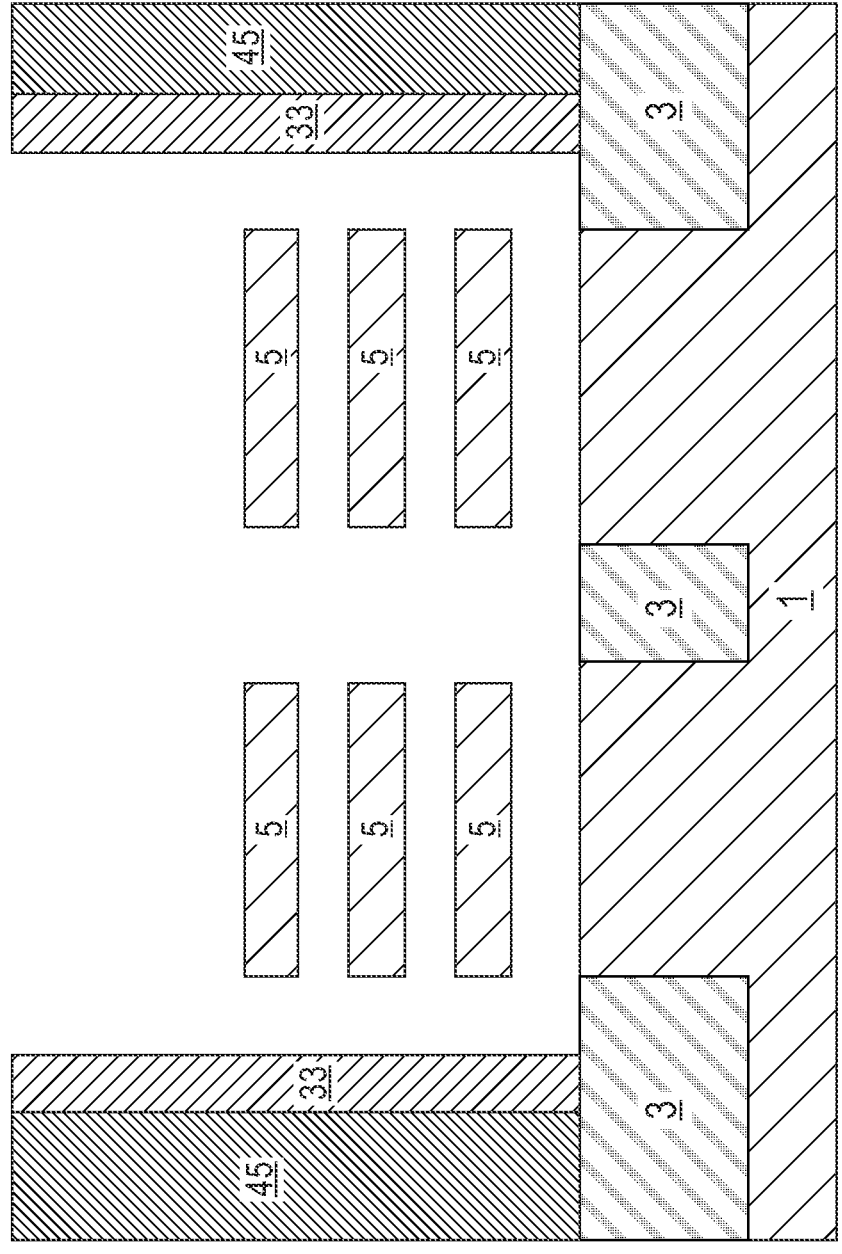
FIG. 5 depicts a cross-sectional view of the semiconductor structure after removing the sacrificial gate and the suspension material in each of the nanosheet stacks, in accordance with an embodiment of the present invention

FIG. 5 depicts a cross-sectional view of the semiconductor structure after removing sacrificial gate 21 and suspension material 4, in accordance with an embodiment of the present invention. As depicted, FIG. 5 includes semiconductor substrate 1, STI 3, ILD 45, spacer 33, and channel material 5. Using known one or more known etching processes to remove sacrificial gate 21, such as RIE, dry etch (e.g., a gas phase etching process) or a lateral etch process, such as a dry etch or a wet etch process to remove suspension material 4 between the layers of channel material 5. The etching process leaves the remaining portions of channel material 5 (e.g., from nanosheet stacks 10A and 10B depicted in FIG. 1A).

Figure 6:
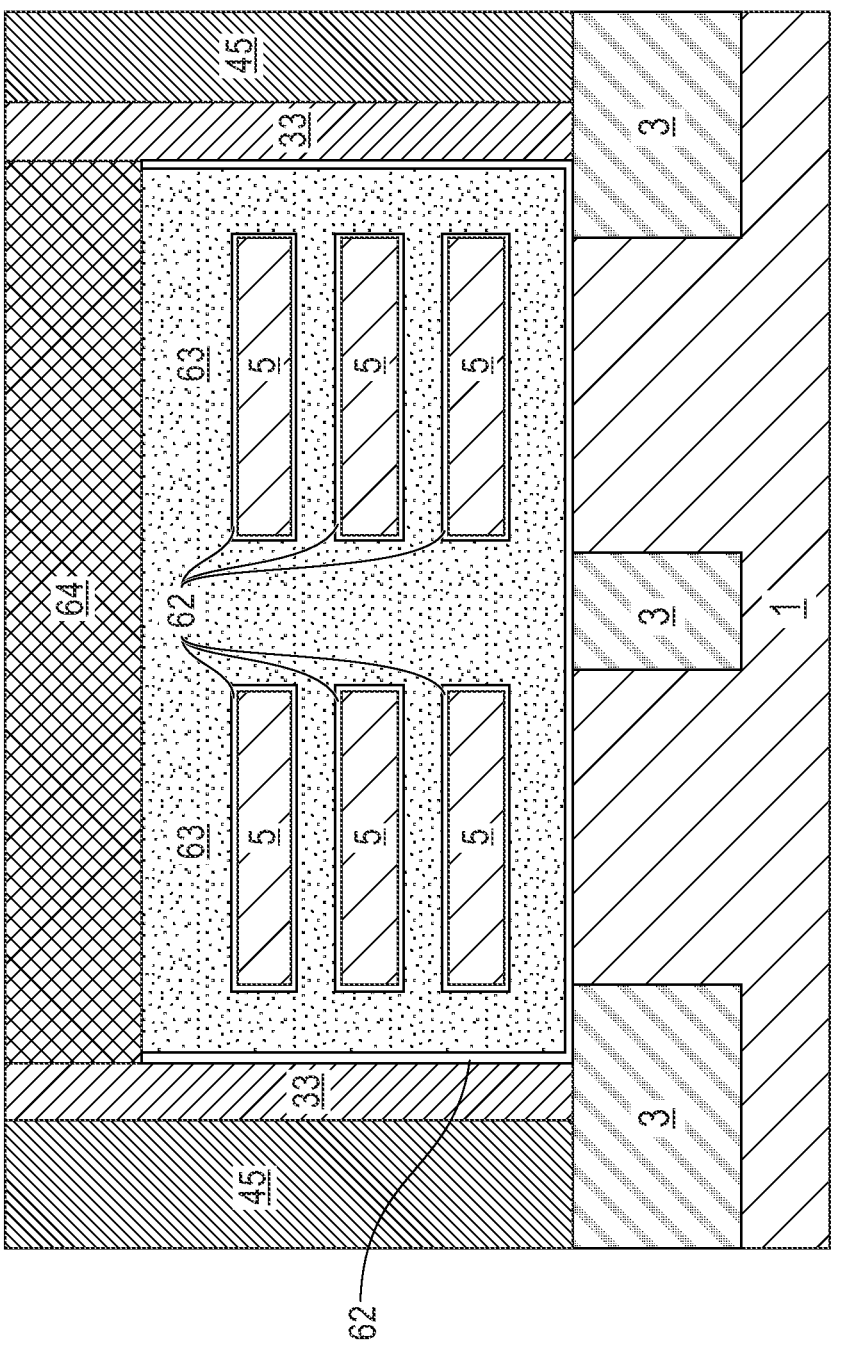
FIG. 6 depicts a cross-sectional view of the semiconductor structure after depositing a gate dielectric material and forming a metal gate covered by a cap material, in accordance with an embodiment of the present invention.

FIG. 6 depicts a cross-sectional view of the semiconductor structure after depositing gate dielectric 62, depositing metal gate material 63, depositing cap 64, and recessing metal gate material 63 and gate dielectric 62, in accordance with an embodiment of the present invention. As depicted, FIG. 6 includes the elements of FIG. 5 and gate dielectric 62 around each of channel material 5 and on spacer 33 abutting metal gate material 63. After metal gate material 63 and gate dielectric 62 are recessed, cap 64 is deposited over the exposed portions of metal gate material 63 and gate dielectric 62. The sides of cap 64 abut spacer 33. In various embodiments, gate dielectric 62 is a high-k gate dielectric material. In various embodiments, metal gate material 63 is a metal material for a gate electrode (e.g., a metal gate electrode material).

Gate dielectric 62 can be any dielectric or high-k dielectric material used in semiconductor logic devices or in metal-insulator-metal (MIM) capacitors. For example, gate dielectric 62 can be but is not limited to an oxide material such as hafnium oxide (e.g., HfO$_2$), or any other suitable high-k dielectric with a dielectric constant greater than 4. In one embodiment, gate dielectric 62 is a dielectric material with a dielectric constant equal to or less than 4 (e.g., SiO$_2$, etc.). Gate dielectric 62 may be a thin layer of a dielectric material that can be conformally deposited using ALD or CVD, for example over exposed surfaces of channel material 5, semiconductor substrate 1, and spacer 33.

In some embodiments, gate dielectric 62 is deposited in the same deposition process and with the same dielectric material, such as HfO$_2$ that is being deposited and used as a gate dielectric material in logic devices (not depicted) on semiconductor substrate 1. In some embodiments, gate dielectric 62 has the same thickness as the dielectric material deposited at the same time in the logic devices. In other embodiments, gate dielectric 62 is not deposited in logic devices (not depicted) or is deposited in a different deposition process. For example, gate dielectric 62 is a different dielectric material and/or has a different thickness than the dielectric materials deposited in the logic devices (not depicted) that may be present on semiconductor substrate 1.

Figure 12:
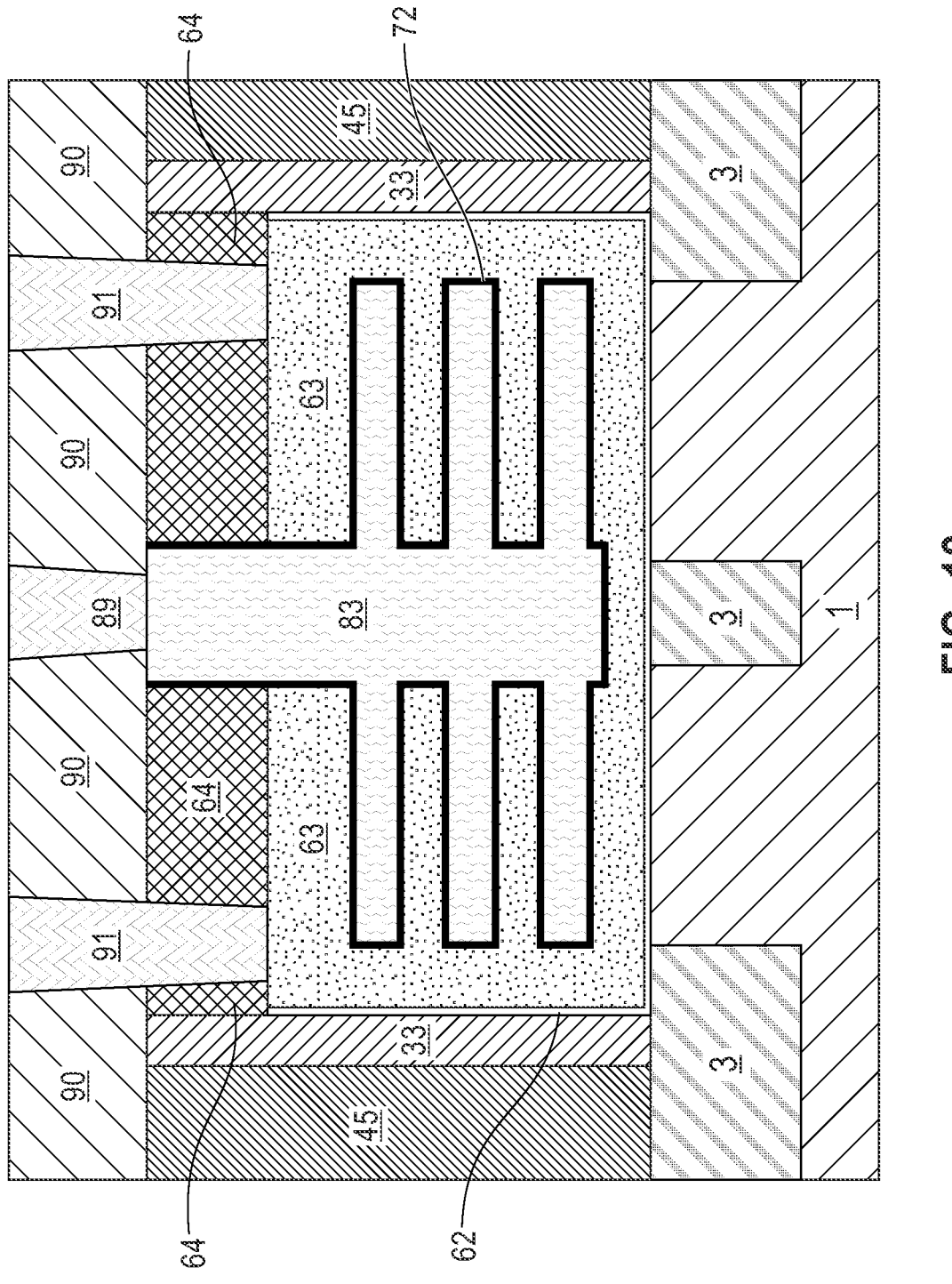
FIG. 12 depicts a cross-sectional view of the semiconductor structure after forming electrode contacts to the metal-insulator-metal (MIM) capacitor, in accordance with an embodiment of the present invention.
Figure 13:
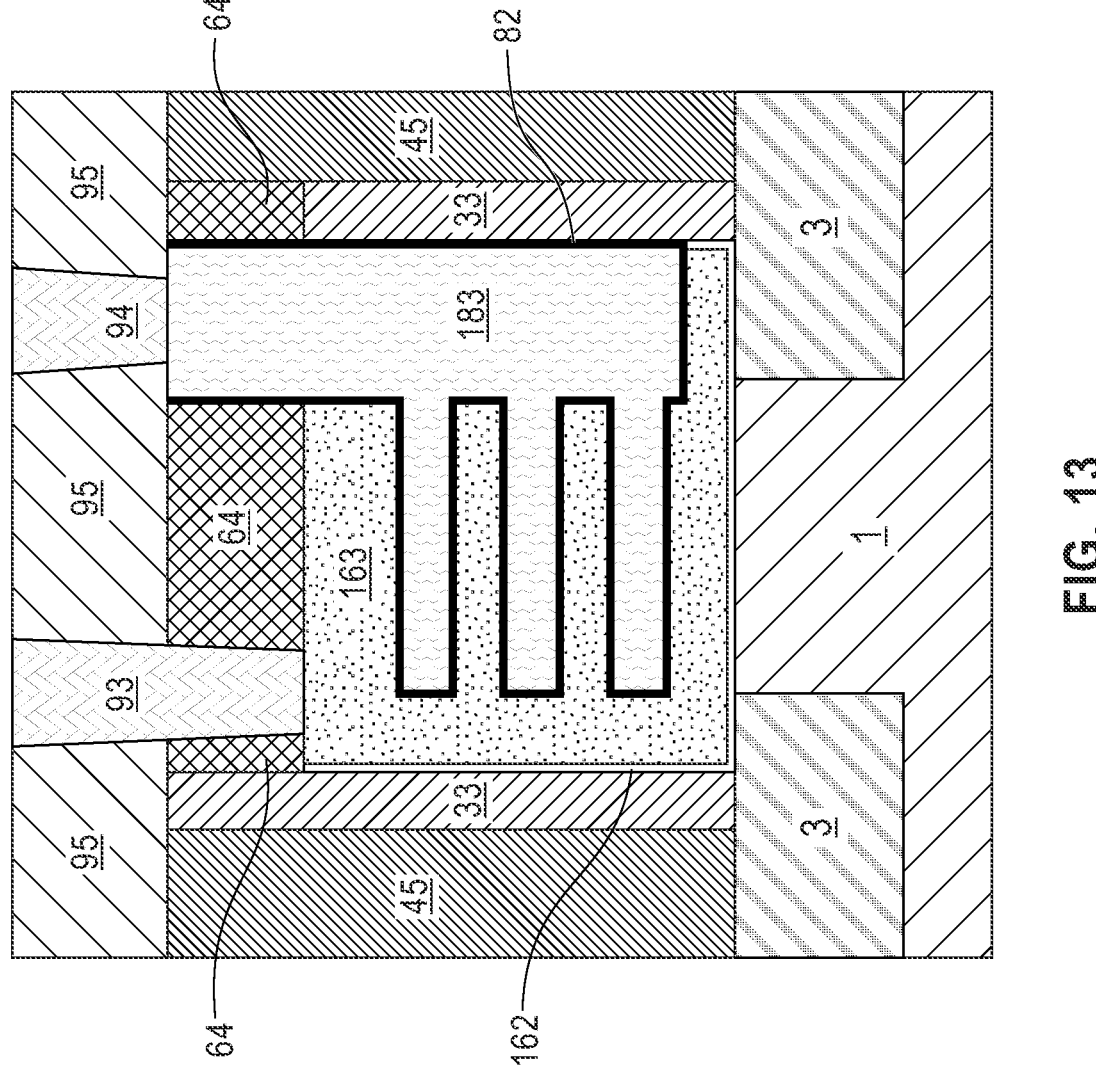
FIG. 13 depicts a cross-sectional view of the semiconductor structure of a single-sided MIM capacitor, in accordance with an embodiment of the present invention.

Metal gate material 63 can be deposited by any suitable process or any suitable combination of multiple processes, including but not limited to, ALD, CVD, PVD, sputtering, plating, evaporation, ion beam deposition, electron beam deposition, laser-assisted deposition, chemical solution deposition, etc. In various embodiments, metal gate material 63 is a metal gate material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti$_3$Al, ZrAl), TaMgC, carbon nanotube, conductive carbon, graphene, or any suitable combination of these materials. In other embodiments, metal gate material 63 is multilayered stack of metal materials and may include one or more workfunction metal materials such as but not limited including but not limited to titanium nitride (TiN), titanium aluminum nitride (TiAlN), TiC, TiCAl, W, or another suitable metal material. In various embodiments, metal gate material 63 forms an electrode of the MIM capacitor (e.g., as depicted in FIGS. 12 and 13). As with the processes and materials forming the comb-like MIM capacitor, metal gate material 63 can be deposited with the same process as metal gate deposition in a logic device and may be the same material as the metal gate in the logic device(s).

Metal gate material 63 fills in the area inside spacer 33. Using one or more etching processes, such as RIE, another dry etching process, or a wet etching process, metal gate material 63 and gate dielectric 62 abutting metal gate material 63 are recessed. The top portion of metal gate material 63 and gate dielectric 62 are removed. Cap 64 is deposited over exposed surfaces of metal gate material 63 and spacer 33 using conventional deposition technics such as ALD, CVD, or PECVD. Cap 64 can be any dielectric capping material such as but not limited to SiN. In one embodiment, a CMP planarizes the top surface of the semiconductor structure.

Figure 7:
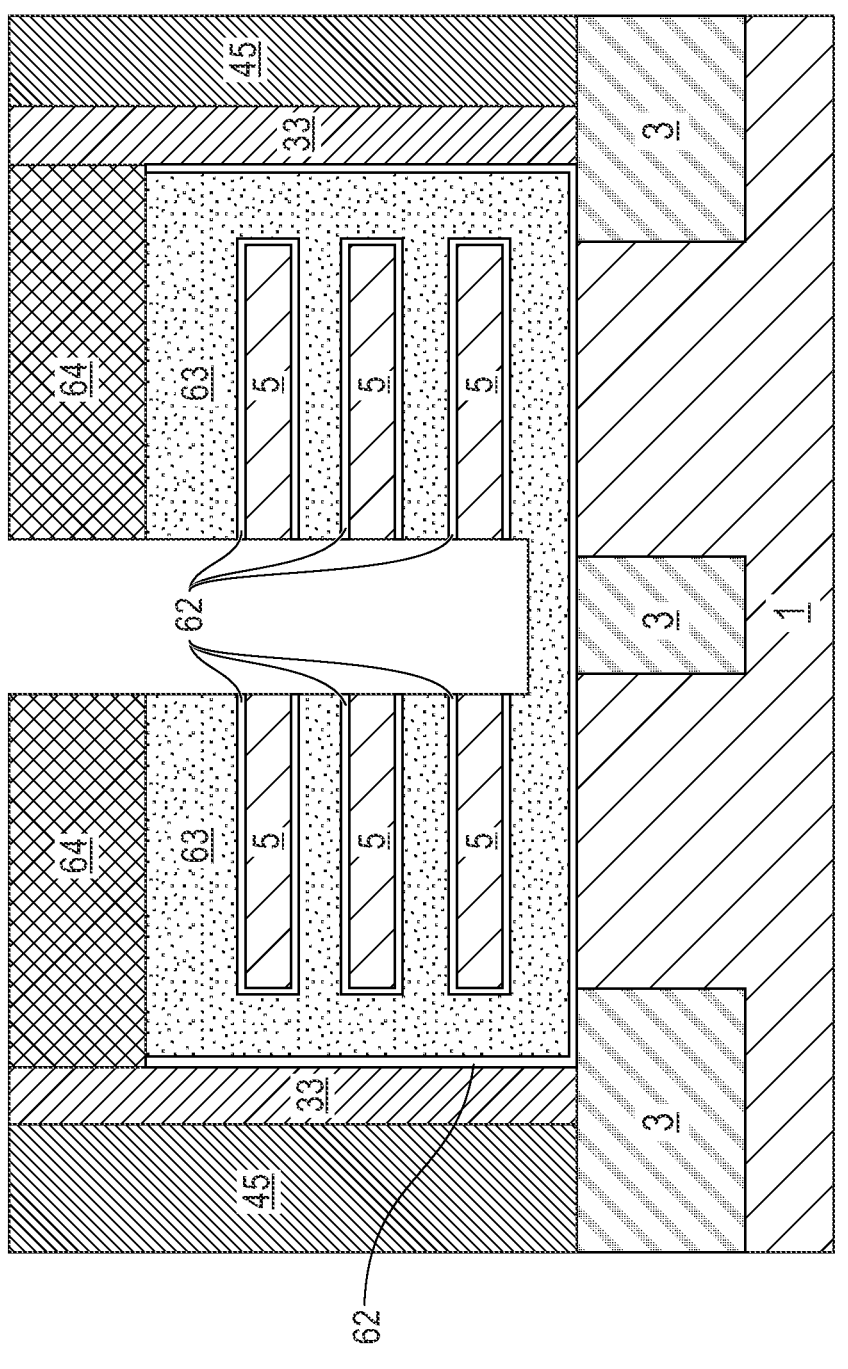
FIG. 7 depicts a cross-sectional view of the semiconductor structure after removing a center portion of the metal gate, the center portion of the cap between the nanosheet stacks, and edges of the nanosheet stacks adjacent to the removed center of the metal gate, in accordance with an embodiment of the present invention.

FIG. 7 depicts a cross-sectional view of the semiconductor structure after removing a center portion of metal gate material 63, cap 64, and the edges of channel material 5 and gate dielectric 62 in the central portion of the semiconductor structure, in accordance with an embodiment of the present invention. After patterning cap 64, a directional etch, such as RIE removes the center portions of metal gate material 63, cap 64, and the inner edges of channel material 5 and gate dielectric 62 over the removed portion of channel material 5 e.g., in the center of metal gate material 63 that is equidistant from spacer 33 or halfway between sidewall spacer 33 in FIG. 7). Removing the materials in the center portion of the semiconductor structure creates a MIM opening for forming a portion of the MIM capacitor. The MIM opening is the central, vertical opening in the semiconductor structure of FIG. 7 that is between channel material 5 in the remaining portions of the two nanosheet stacks 10A and 10B depicted in FIG. 1A.

As depicted, the RIE extends through cap 64, metal gate material 63, the inner edges of the bottom layer of channel material 5 that is covered by gate dielectric 62, and into or stopping at metal gate material 63 under the bottom layer of channel material 5 that is covered by gate dielectric 62. The RIE removes a rectangular portion of cap 64 and metal gate material 63 along with the edges of channel material 5 covered gate dielectric 62. After the etching process, the rectangular opening extends along the length of each of the two nanosheet stacks (e.g., channel material 5) and extends perpendicular to the cross-section Y-Y depicted in FIG. 2B (e.g., the opening runs perpendicular to the cross-sectional view depicted in FIG. 7). The opening exposes the edges of cap 64, metal gate material 63, gate dielectric 62 on each of channel material 5, and a bottom portion of metal gate material 63 in the center of the semiconductor structure depicted in FIG. 7.

Figure 8:
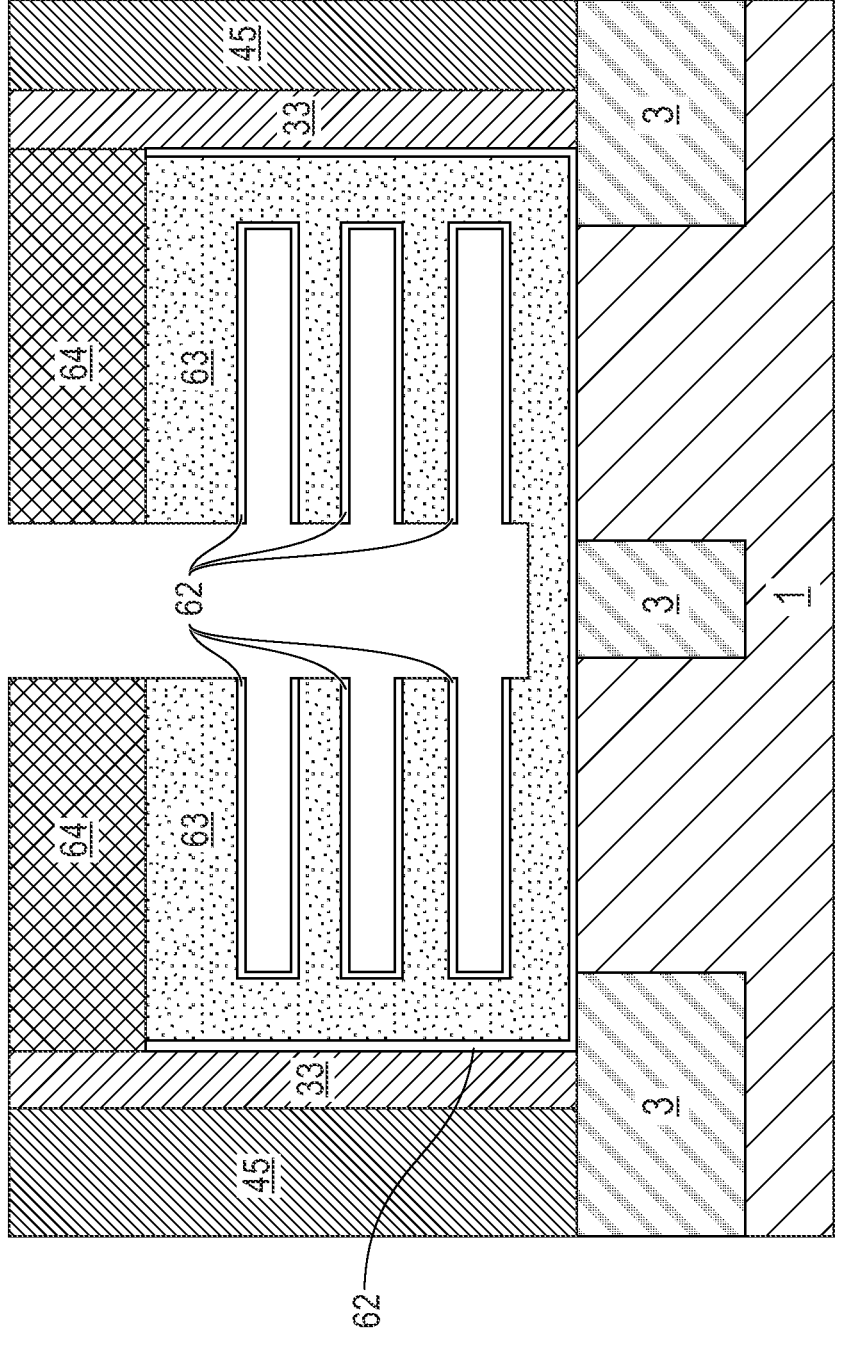
FIG. 8 depicts a cross-sectional view of the semiconductor structure after removing the channel layers in the nanosheet stacks, in accordance with an embodiment of the present invention.

FIG. 8 depicts a cross-sectional view of the semiconductor structure after removing channel material 5, in accordance with an embodiment of the present invention. Using an isotropic etching process for a lateral etch of channel material 5, such as an RIE or a dry gas-phase etching process, the remaining portions of channel material 5 are removed. As depicted, FIG. 8 includes gate dielectric 62, metal gate material 63, cap 64, spacer 33, ILD 45, STIs 3, and substrate 1. After the lateral etching process, gate dielectric 62 remains abutting spacer 33, under metal gate material 63, and inside metal gate material 63 where gate dielectric 62 surrounded channel material 5 before the lateral etching process. After removing channel material 5, as depicted in FIG. 8, two sets of stacked and vertically aligned horizontal openings abutting or joining the MIM opening are formed. In other embodiments, a single set of stacked and vertically aligned horizontal openings are formed (e.g., when only one nanosheet stack is used). In other embodiments, multiple sets of stacked and vertically aligned horizontal openings are formed connecting to adjacent MIM capacitor openings.

Figure 9:
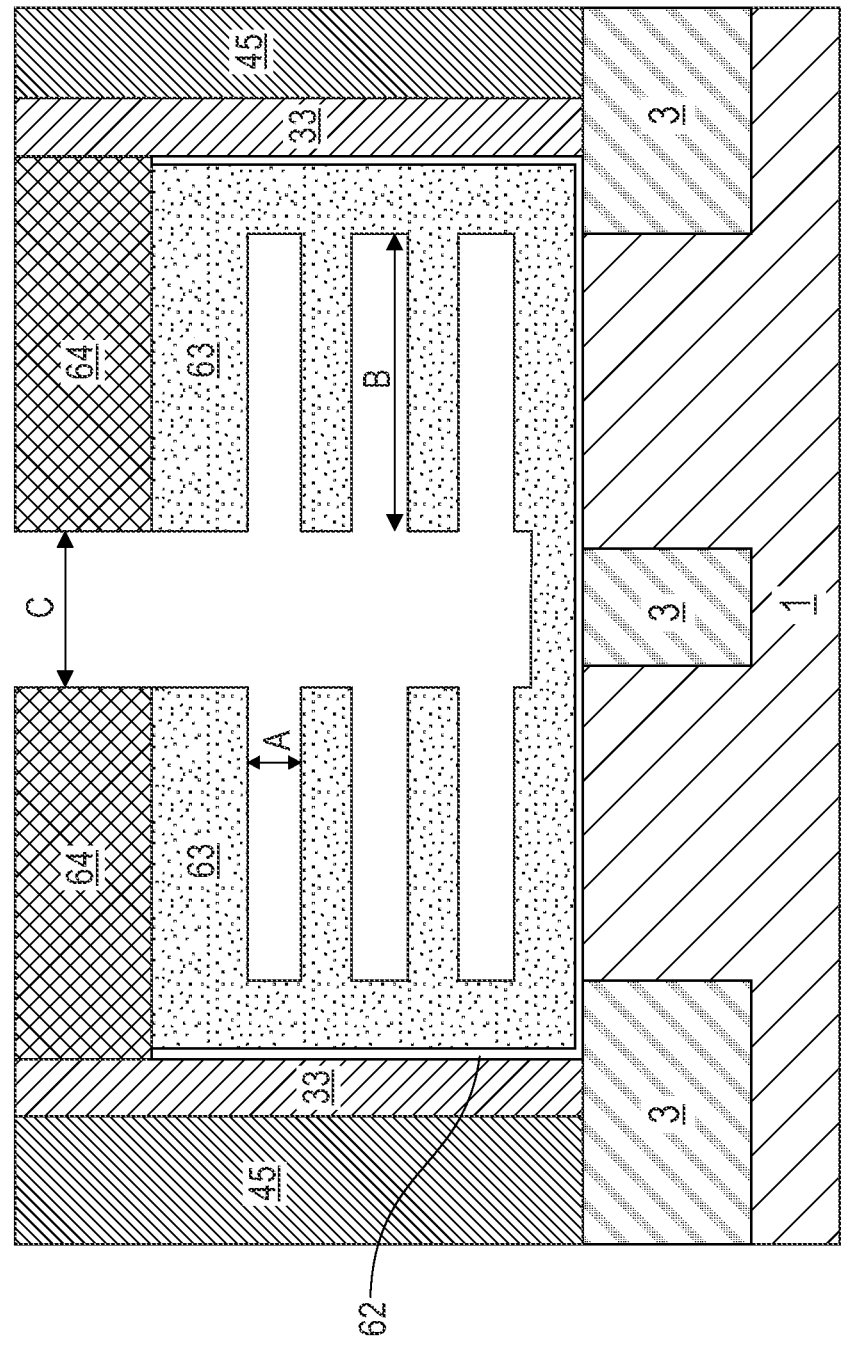
FIG. 9 depicts a cross-sectional view of the semiconductor structure after removing exposed portions of the gate dielectric material, in accordance with an embodiment of the present invention.

FIG. 9 depicts a cross-sectional view of the semiconductor structure after removing exposed portions of the gate dielectric 62, in accordance with an embodiment of the present invention. As depicted, FIG. 9 includes the elements of FIG. 8 without exposed portions of gate dielectric 62 inside the thin, horizontal openings in metal gate material 63 where channel material 5 previously resided. In one embodiment, gate dielectric 62 is not removed. In this embodiment (not depicted in FIG. 9), gate dielectric 62 is the insulator for the completed MIM capacitor.

Using an isotropic etch such as but not limited to a dry phase gaseous etch process or wet etch process, the exposed portions of high-k dielectric 61 inside the thin, horizontal openings inside metal gate material 63 connect with the MIM opening. Also illustrated in FIG. 9 is height A of the thin, horizontal openings in metal gate material 63. In various embodiments, the height A ranges from 5 nm to 15 nm but is not limited to these heights.

Additionally, illustrated in FIG. 9 is a length, B of each of the thin, horizontal openings forming the teeth of the comb-like openings in metal gate material 63. Length B is the horizontal length of the set of stacked horizontal openings in metal gate material 63 that can range from 15 nm to 100 nm but is not limited to these lengths. FIG. 9 also illustrates a width, C that is the horizontal width of the opening between vertical sides of the remaining portions of cap 64. For example, the width C of the opening in cap 64 can range between 20 nm and 100 nm but is not limited to these widths. The width C of the opening can be the width of the MIM opening formed as previously discussed with reference to FIG. 7. As depicted, width C of the MIM opening in the center of FIG. 9 extends down to the bottom portion of metal gate material 63 above the center STI 3.

Figure 10:
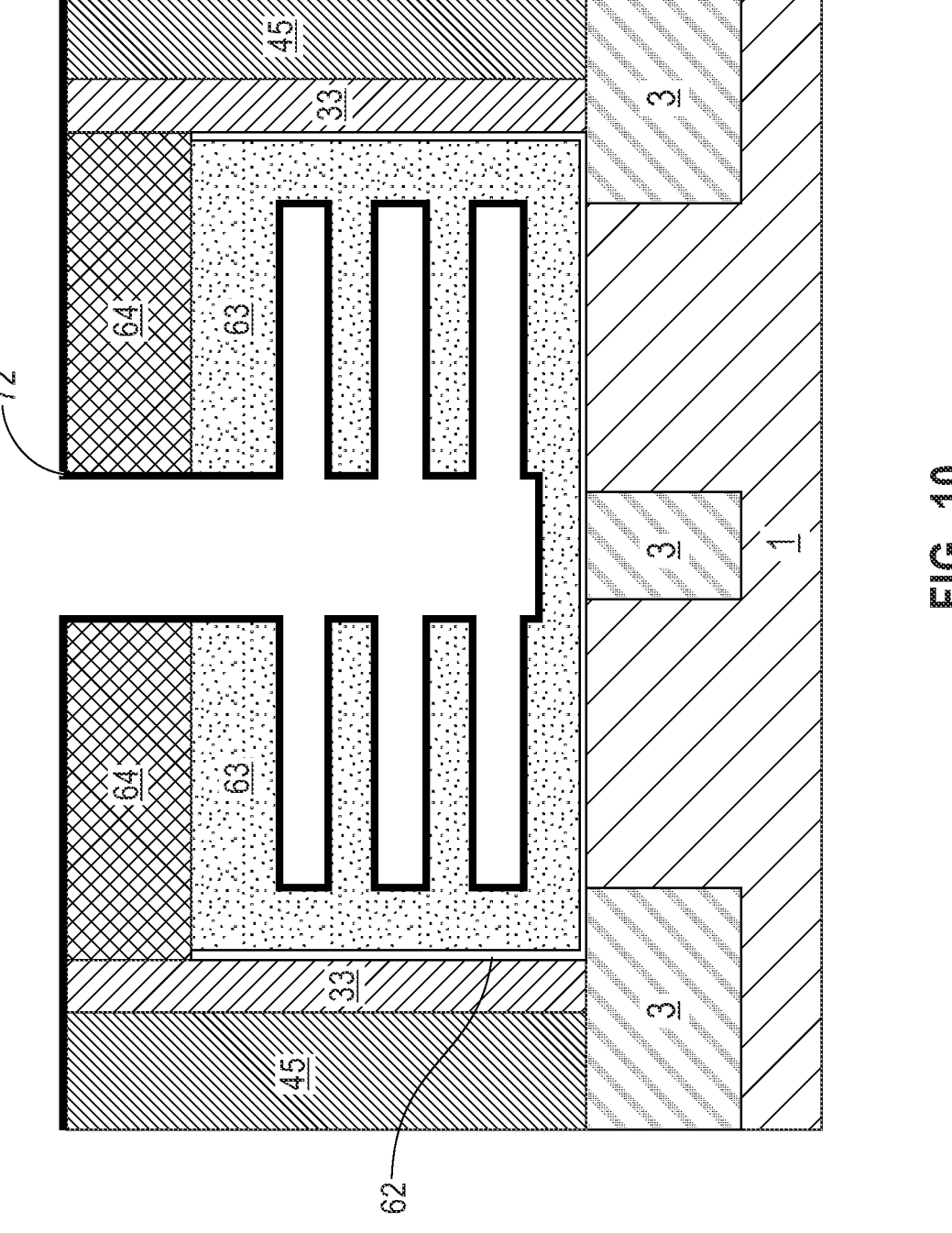
FIG. 10 depicts a cross-sectional view of the semiconductor structure after depositing another layer of a dielectric material over exposed surfaces of the semiconductor structure, in accordance with an embodiment of the present invention.

FIG. 10 depicts a cross-sectional view of the semiconductor structure after depositing dielectric material 72 above exposed surfaces of the semiconductor structure, in accordance with an embodiment of the present invention. As depicted, dielectric material 72 is deposited over the exposed surfaces of ILD 45, spacer 33, cap 64, and metal gate material 63. In various embodiments, dielectric material 72 is an insulator in the MIM capacitor depicted in FIGS. 12 and 13. In some embodiments, when gate dielectric 62 is not removed, as previously discussed with respect to FIG. 9, a layer of dielectric material 72 is deposited over gate dielectric 62 to form a bi-layer insulator for the MIM capacitor. In another embodiment, when gate dielectric 62 is not removed, dielectric material 72 is composed of more than one layer of dielectric materials (i.e., dielectric material 72 is a multilayer dielectric deposited on gate dielectric 62).

Using one of ALD or CVD, for example, a thin layer of a high-k dielectric material, such as but not limited to hafnium oxide (e.g., $HfO_2$), zirconium oxide (e.g., ZrO2), or a multi-layer of $HfO_2$ and ZrO2. In various embodiments, dielectric material 72 is a high-k gate dielectric material. The thickness of dielectric material 72 can be 2 nm to 10 nm but is not limited to these thicknesses.

Dielectric material 72 can be the same material as gate dielectric 62 with the same thickness as gate dielectric 62. Dielectric material 72 can be the same material with the same thickness as a dielectric material or a high-k gate dielectric material deposited in a logic device formed in another region of substrate 1. In other embodiments, dielectric material 72 is a different dielectric material than gate dielectric 62. In some embodiments, dielectric material 72 is a different material with a different thickness than a gate dielectric in a logic device formed on or in semiconductor substrate 1. In another embodiment, dielectric material 72 has a different thickness than gate dielectric 62 (e.g., dielectric material 72 can be thinner or thicker than gate dielectric 62). In some embodiments, dielectric material 72 is composed of more than one layer of different dielectric materials.

In various embodiments, dielectric material 72 is a multilayer dielectric material. The multilayer dielectric material may include a layer of a high-k dielectric material. In one embodiment, dielectric material 72 resides on gate dielectric 62 when gate dielectric 62 is not removed. In some cases, dielectric material 72 includes multiple layers of dielectric material that are deposited on gate dielectric 62.

Figure 11:
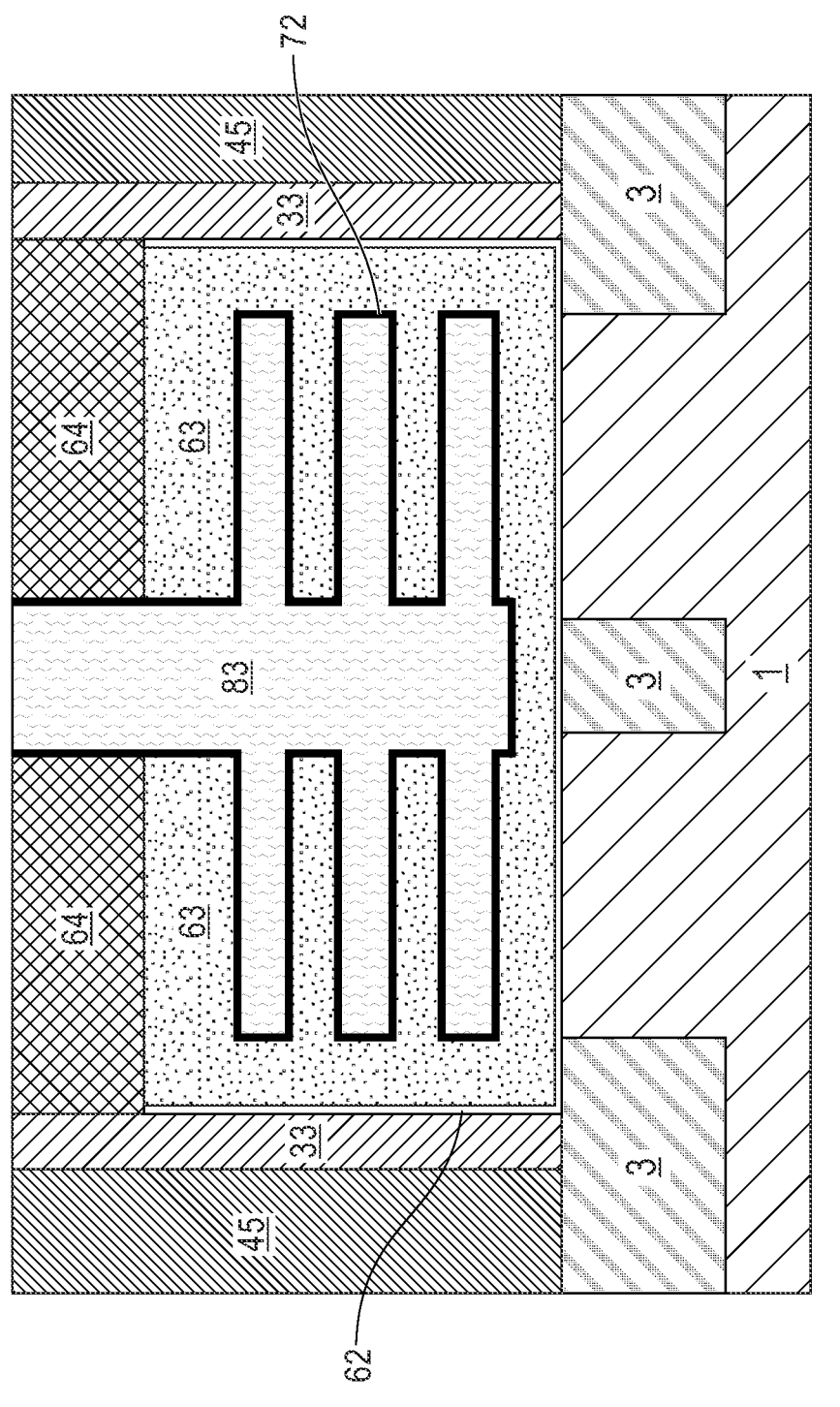
FIG. 11 depicts a cross-sectional view of the semiconductor structure after depositing a metal material over the semiconductor structure and performing a CMP, in accordance with an embodiment of the present invention.

FIG. 11 depicts a cross-sectional view of the semiconductor structures after depositing metal material 83 inside dielectric material 72 on the sides of the opening in cap 64 and metal gate material 63, over the top surface of the semiconductor structure and performing a CMP, in accordance with an embodiment of the present invention. As depicted, FIG. 11 includes the elements of FIG. 10 with metal material 83.

In various embodiments, metal material 83 is TiN but is not limited to this metal nitride material. Metal material 83 can be a metal material that is used as an electrode in capacitors or MIM capacitors (e.g., MIM caps). In various embodiments, metal material 83 can be TiN. In other examples, metal material 83 can be TaN, ZrN, WN, or other compounds of these materials but metal material 83 is not limited to these electrode materials. Metal material 83 can be deposited by CVD, PVD, ALD, electroplating, or another capacitor metal deposition method. Metal material 83 covers dielectric material 72 inside metal gate material 63 and is deposited on the top surface of the semiconductor structure. The CMP removes metal material 83 over ILD 45, spacer 33, and cap 64 and leaves only the portion of metal material 83 that is inside dielectric material 72. In some cases, small portions of the top surface of ILD 45, spacer 33, and cap 64 are also removed by the CMP.

As depicted, after the CMP, the top surfaces of ILD 45, spacer 33, cap 64, and metal material 83 are level and flat. Metal material 83 fills the central vertical opening coated with dielectric material 72 that extends from the top surface of the semiconductor structure depicted in FIG. 11 through cap 64 and a portion of metal gate material 63 and also fills the thin, horizontal openings extending outward from the central vertical opening. In this way, metal material 83 on dielectric material 72 forms three vertically separated horizontal plates. Any number of thin and vertically aligned horizontal plates formed by metal material 83 in metal gate material 63 can be formed in other examples using the processes discussed above with respect to FIGS. 1-11. For example, a semiconductor structure with five thin, horizontal portions of metal material 83 extending into metal gate material 63 can be formed with metal material 83. Metal material 83 is electrically isolated from metal gate material 63 by dielectric material 72.

The semiconductor structure depicted in FIG. 11 can be a MIM capacitor formed using one or more high-k dielectric materials. The MIM capacitor depicted in FIG. 11 provides a high-density MIM capacitor that is formed using nanosheet stacks. The processes discussed above can be combined or be some of the same processes as used in logic device or memory device formation with nanosheet stacks. In this way, the MIM capacitor formed with metal material 83 surrounded by dielectric material 72 for electrical isolation from metal gate material 63 can be a cost-effective, high-density capacitor.

FIG. 12 depicts a cross-sectional view of the semiconductor structure after forming electrode contact 89 and electrode contacts 91, in accordance with an embodiment of the present invention. As depicted, FIG. 12 includes the elements of FIG. 11 and ILD 90, electrode contact 89, and two electrode contacts 91. In FIG. 12, metal material 83, dielectric material 72, and metal gate material 63 that is surrounded on the sides and bottom surfaces by gate dielectric 62 and covered by cap 64 forms the MIM capacitor with three electrode contacts (e.g., electrode contact 89 and two electrode contacts 91). While FIG. 12 depicts two of electrode contacts 91, in other embodiments, the MIM capacitor has only one electrode contact 91 connecting to metal gate material 63.

Electrode contact 89 and electrode contacts 91 can be formed using known middle of the line (MOL) processes and/or back end of the line (BEOL) processes, such as dual or single damascene processes for contact formation. For example, ILD 90 can be deposited, patterned, and contact holes or vias can be etched in ILD 90 and cap 64. A contact metal deposition (e.g., W, Co, Cu, etc.) occurs that is followed by a CMP to form electrode contact 89 and electrode contacts 91. Electrode contact 89 connects to the top exposed surface of the center of metal material 83 where metal material 83 extends up through cap 64 (e.g., in the center of the semiconductor structure for the MIM capacitor) and each of electrode contacts 91 connect to metal gate material 63 on either side of top contact 89 (e.g., adjacent to spacer 33). As depicted in FIG. 12, electrode contact 89 resides in ILD 90 while electrode contacts 91 reside in cap 64 and ILD 90. Spacer 33 abuts the sides of gate dielectric 62 surrounding metal gate material 63.

FIG. 13 depicts a cross-sectional view of the semiconductor structure of a MIM capacitor formed with a single nanosheet stack, in accordance with an embodiment of the present invention. As depicted, FIG. 13 includes electrode contact 94, electrode contact 93, ILD 95, metal electrode material 183 surrounded by dielectric material 82, gate material 163, gate dielectric 162 under gate material 163 and abutting one side of gate material 163 and a bottom portion of the other side of gate material 163, cap 64, spacer 33, ILD 45, STI 3, and semiconductor substrate 1. Gate material 163, metal electrode material 183, dielectric material 82, and gate dielectric 162 can be formed with similar processes with essentially the same materials as metal gate material 63, metal material 83, dielectric material 72, and gate dielectric 62, respectively. Dielectric material 82, like gate material 72 can be an insulator in the MIM capacitor and similarly, dielectric 162 can be a MIM capacitor insulator.

As depicted in FIG. 13, the MIM capacitor formed using metal electrode material 183 that is electrically isolated from gate material 163 by dielectric material 82. Metal electrode material 183 forms only one set of stacked horizontal plate-like portions of metal electrode material 183. The set of stacked horizontal plate-like portions of metal electrode material 183 extends in one direction from the central, vertical portion of metal electrode material 183. In this embodiment, the horizontal extensions of metal electrode material 183 form a comb-like MIM capacitor as depicted in FIG. 13 from a single nanosheet stack. For example, the single-sided comb-like MIM capacitor depicted in FIG. 13 has a set of flat, horizontal portions of metal electrode material 183 extending horizontally to the left of the central, vertical portion of metal electrode material 183. Metal electrode material 183 has sides and a bottom surface that is covered by dielectric material 82 as one of the MIM capacitor insulators. Gate material 163 surrounds a left-side and bottom of gate dielectric 162 and is surrounded on the right-side by dielectric material 82 that is over metal electrode material 183. Electrode contact 94 connects to the top surface of metal electrode material 183 and electrode contact 93 contacts a top surface of gate metal material 163.

Figure 14:
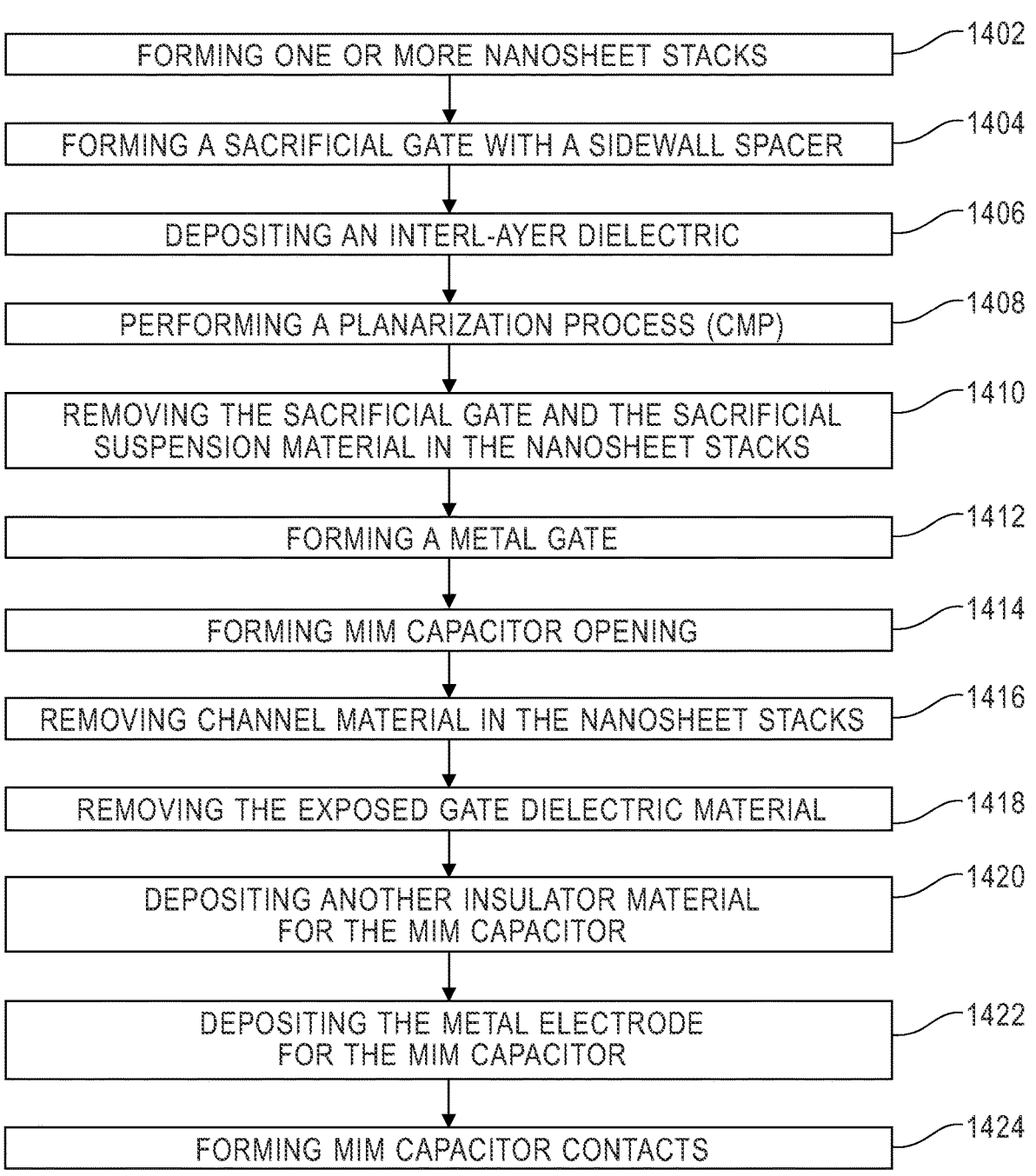
FIG. 14 depicts an example of a process flow of steps to form a MIM capacitor using one or more nanosheet stacks, in accordance with an embodiment of the present invention.

FIG. 14 depicts an example of the steps of a process flow to form a comb-like MIM capacitor using one or more nanosheet stacks, in accordance with an embodiment of the present invention.

In step 1402, the method includes forming one or more nanosheet stacks. Using conventional nanosheet stack formation processes. As known to one skilled in the art, conventional nanosheet stack formation may include using epitaxy to grow alternating layers of a sacrificial semiconductor material (i.e., suspension material 4), such as silicon germanium and a channel material (i.e., channel material 5), such as silicon on a semiconductor substrate. The top nanosheet layer may be patterned. One or more portions of the alternating layer of the nanosheet layers of semiconductor materials can be removed, for example, using an RIE to form one or more nanosheet stacks on the semiconductor substrate.

In step 1404, the method includes forming a sacrificial gate with a sidewall spacer. The sacrificial gate material can be deposited, for example by CVD or PVD over the semiconductor structure with one or more nanosheet stacks. A gate hardmask material is deposited over the sacrificial gate material. In various embodiments, the sacrificial gate material is etched to cover each of the nanosheet stacks and extends a small distance beyond the nanosheet stacks (e.g., as depicted in FIG. 2B).

This step includes using conventional sidewall spacer formation processes to deposit, for example by ALD, a thin layer of a dielectric spacer material over the semiconductor structure and then, using a directional etch, such as RIE to remove horizontal portions of the dielectric spacer material to form the sidewall spacer around the sacrificial gate.

Figures 16, 17:
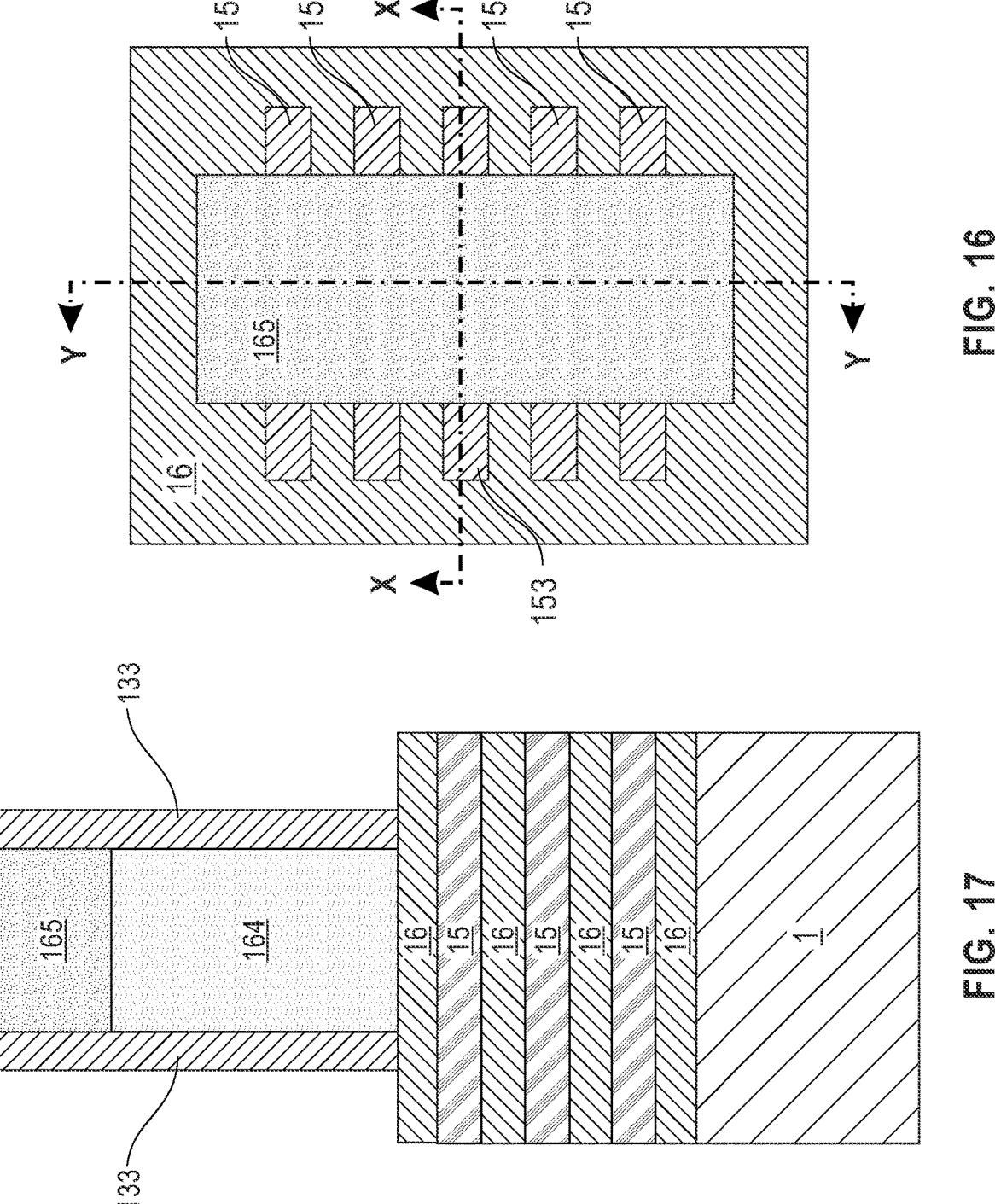
FIG. 16 depicts a top view of five nanosheet stacks forming a sacrificial gate covered by a hardmask, in accordance with an embodiment of the present invention.
FIG. 17 depicts a cross-sectional view of the semiconductor structure in an X-X direction after forming a sacrificial gate covered by the hardmask and surrounded by a sidewall spacer on the nanosheet stacks, in accordance with an embodiment of the present invention.
Figures 19, 20:
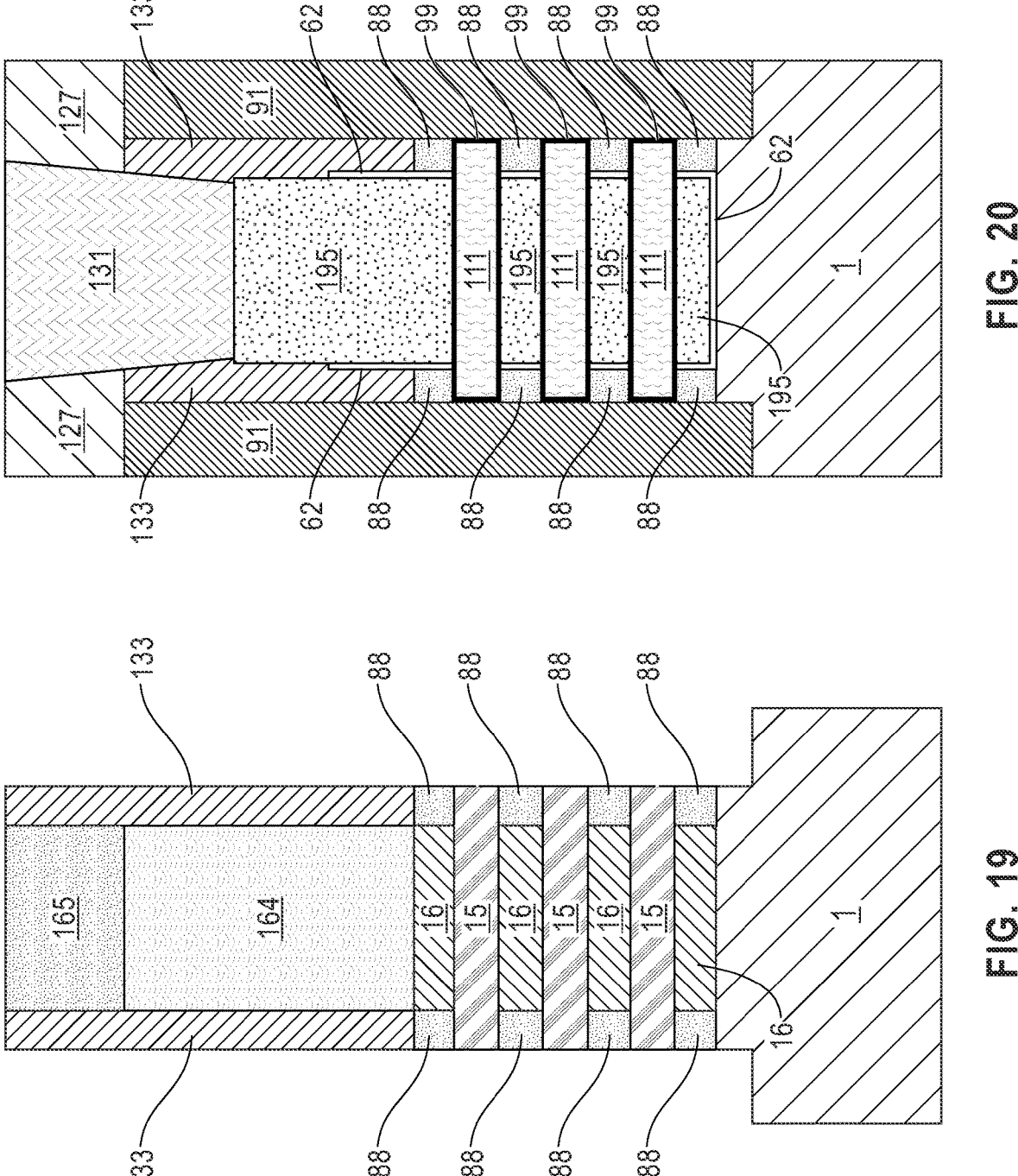
FIG. 19 depicts a cross-sectional view of the semiconductor structure in the X-X direction after recessing the suspension material to form inner spacers, in accordance with an embodiment of the present invention.
FIG. 20 depicts a cross-sectional view of the semiconductor structure in the X-X direction after completing the MIM capacitor and forming the MIM capacitor electrode contacts, in accordance with an embodiment of the present invention.

In other embodiments, the sacrificial gate material covers only a central portion of a number of nanosheet stacks (e.g., as depicted in FIG. 16). In these embodiments, the sacrificial gate material is etched to leave the outer portions of each nanosheet stack uncovered by the sacrificial gate material. In some embodiments, when the sacrificial gate only covers the central portion of the nanosheet stacks and the nanosheet stacks extend beyond the sacrificial gate in the X-X direction as depicted in FIG. 16, then a process step can be added after sidewall spacer formation to recess the suspension material in the nanosheet stack forming a fin. In some embodiments, an inner spacer can be formed between exposed surfaces of the silicon nanosheet layers abutting the remaining suspension material in the nanosheet stacks. In these examples, the MIM capacitor will have inner spacers in the X-X direction cross-section as depicted in FIGS. 19 and 20.

In step 1406, the method includes depositing an ILD material over the semiconductor structure. Using CVD, PVC, or another suitable ILD deposition process, an ILD material is deposited over the semiconductor structure. The ILD can be composed of any ILD material (e.g., $SiO_2$, etc.).

In step 1408, the method includes performing a CMP. The removes the gate hardmask and the top portions of the ILD. After the CMP, the sacrificial gate material and a top surface of the sidewall spacer are exposed along with the remaining portions of the ILD.

In step 1410, the method includes removing the sacrificial gate and the sacrificial semiconductor material in the nanosheet stacks. Using an etching process, for example, using RIE, the sacrificial gate material is removed. The sacrificial semiconductor material (e.g., SiGe) can be removed using a non-directional etching process. One or more wet etching processes and/or a dry etching processes can laterally etch or remove the layers of the sacrificial semiconductor material from the nanosheet stacks. In one example, the sacrificial gate and the sacrificial semiconductor material can be removed together using one or more dry or a wet etching process.

In step 1412, the method includes forming a metal gate. A thin layer of a gate dielectric material is conformally deposited by ALD along the sidewall spacer and on the exposed surfaces of the semiconductor substrate with STIs and around the silicon nanosheet layer remaining from the nanosheet stacks. The gate dielectric material can be a high-k gate dielectric material, such as but not limited to $HfO_2$. In various embodiments, the deposited gate dielectric material will become an insulator in the metal-insulator-metal (MIM) capacitor. In some embodiments, the gate dielectric material is a bi-layer gate dielectric material or a multilayer gate dielectric material, or a bi-layer insulator material for the MIM capacitor.

In some embodiments, the gate dielectric material is the same gate dielectric material as is used in logic devices on the semiconductor substrate. In other embodiments, the high-k dielectric material is deposited as a different high-k dielectric material or is deposited in different steps than a high-k dielectric material used in logic devices on or in the semiconductor substrate.

The metal gate material is deposited by PVD, for example, over the semiconductor structure and around the remaining portions of the nanosheet stack (e.g., around Si nanosheet layers). The metal gate material can comprise any suitable conducting material, including but not limited to, doped polycrystalline, amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au)), a conducting metallic compound material (e.g., tantalum nitride (TaN), titanium nitride (TiN), a multilayered stack of materials which may include a workfunction metal material, such as but not limited to a metal nitride. The metal gate material is deposited over the gate dielectric material and around the channel nanosheet layers that are also covered by the gate dielectric material. In various embodiments, the metal gate material will be an electrode of the completed MIM capacitor.

After depositing the metal gate material, the top portion of the metal gate material and the gate dielectric material is etched. The etching process recesses the metal gate and the high-k gate dielectric below the top surface of the sidewall spacer. A cap material such as SiN, another nitride, or oxide is deposited as a dielectric cap material over the recessed metal gate and along the exposed sidewall spacer. In an embodiment, a CMP may be performed.

In step 1414, the method includes forming a MIM capacitor opening. In various embodiments, using lithographic patterning and a directional etching process, such as RIE a center portion of the gate metal and inside edges of the remaining portions of the adjacent nanosheet stacks are removed. The MIM opening extends through and above the metal gate material.

As depicted in FIG. 7, the center, vertical portion of the metal gate, and approximately 5 to 30% of the inside or facing portions of the remaining channel nanosheet layers with the gate dielectric material are removed along the inside edges of the long direction (e.g., Y-Y direction depicted in FIG. 2B) of the nanosheet stacks. The MIM opening can be formed by removing the center portion of the metal gate, the inside edges of adjacent portions of the channel nanosheet layers and the gate dielectric on the removed portions of the channel nanosheet layers. A rectangular MIM capacitor opening is formed perpendicular to the Y-Y direction illustrated in FIG. 2B and is over STI 3 between nanosheet stacks 10A and 10B depicted in FIG. 2B. The MIM opening extends into a small portion of the inside portions of nanosheet stacks 10A and 10B that are adjacent or facing each other in FIG. 2B.

Figure 15:
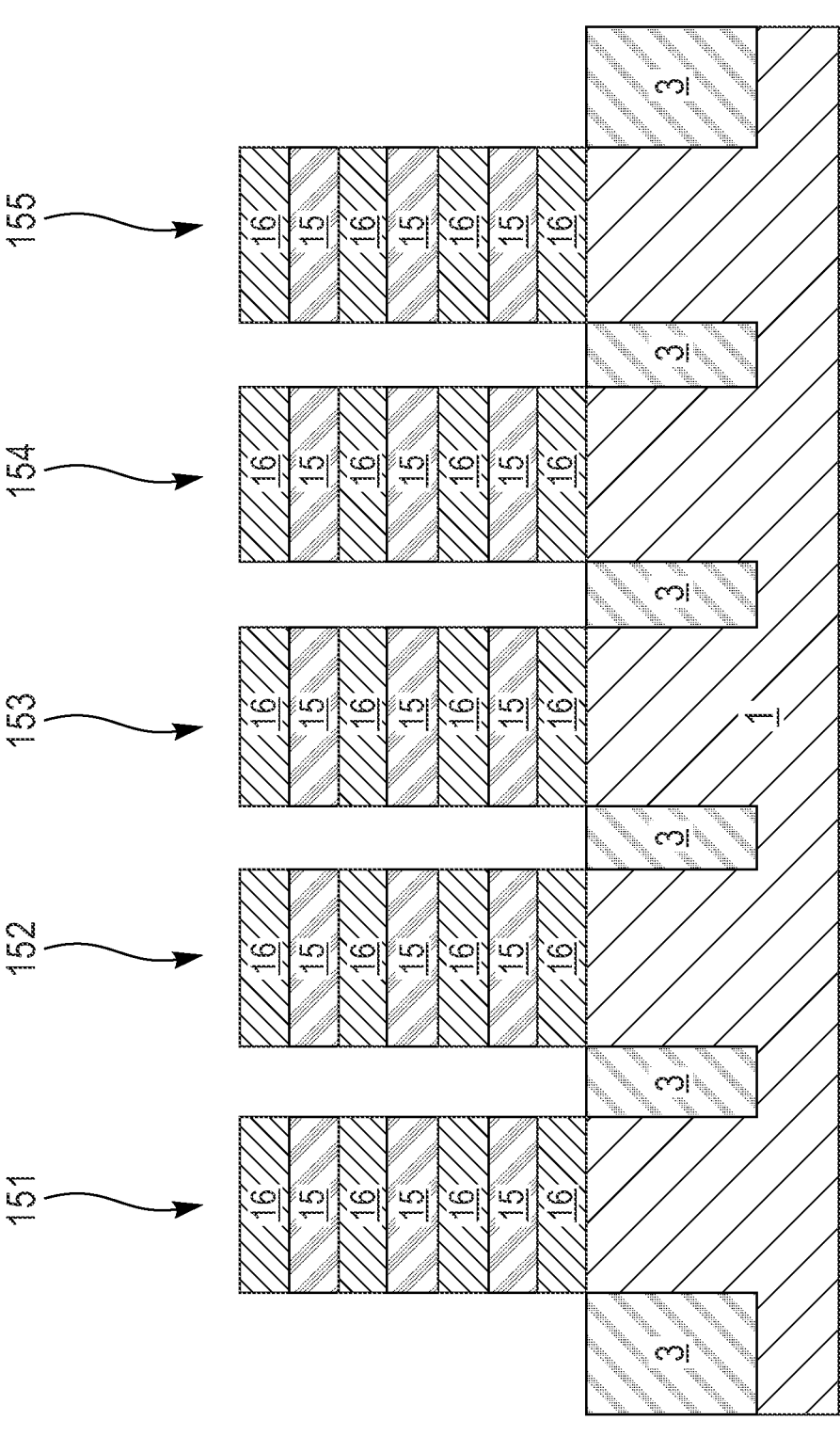
FIG. 15 depicts a cross-sectional view of a semiconductor structure after forming five nanosheet stacks, in accordance with an embodiment of the present invention.

In some embodiments, multiple MM openings are formed between more than two nanosheet stacks. For example, as depicted in FIG. 16, a central metal gate strip that is under the gate hardmask (i.e., labeled gate hardmask 165 in FIG. 16) is on a center portion of each of five nanosheet stacks (e.g., nanosheet stacks 151, 152, 153, 154, and 155). In this MIM capacitor example, four MIM openings can be formed between nanosheet stacks 151, 152, 153, 154, and 155 depicted in FIG. 15. In FIG. 15, the four MIM openings are over the four STI 3 and extend vertically down to an area just below the bottom channel material (e.g., Si) nanosheet layer.

In step 1416, the method includes using a lateral etching process to remove the remaining channel nanosheet layer of the nanosheet stack. The lateral etching process such as a dry gas-phase etching process or another suitable lateral etching process removes the nanosheet silicon layers. After the etching process, flat, e horizontal arms or teeth of the comb-like structure form openings in the semiconductor structure extend on both sides of the MIM capacitor opening formed in step 1414 (e.g., the central, vertical opening that is between the removed channel nanosheet layers). The central, vertical portion of the opening formed during the etching process previously discussed with respect to step 1414 connects to the flat, horizontal openings formed when the channel material from the nanosheet stacks is removed.

In step 1418, the method includes removing the exposed gate dielectric material. This step can be an optional step. In some embodiments, the gate dielectric material is not removed. In these embodiments, the gate material can be the MIM capacitor insulator or can be a portion of a multilayer MIM capacitor insulator as previously discussed. Using one of a dry or wet etching process, the gate dielectric material remaining on the interior surfaces of the metal gate material is removed. For example, the gate dielectric material that previously surrounded the channel material is removed. After this etching process, the gate dielectric material under and around the sides of the metal gate material remain.

In step 1420, the method includes depositing another layer of dielectric material for a second MIM capacitor insulator over exposed surfaces of the semiconductor structure. In one embodiment, this step is an optional step (e.g., when the gate dielectric material is not removed in step 1418 and is the MIM capacitor insulator). For example, a dielectric material or a high-k dielectric material can be deposited over the ILD, the sidewall spacers, the dielectric cap material, and metal gate material. The high-k dielectric material can be any of the high-k dielectric materials discussed with respect to FIG. 6. The dielectric material deposited over the ILD, the sidewall spacers, the dielectric cap material, and around the inside, exposed metal gate material is an insulating material for the MIM capacitor. The dielectric material will electrically isolate the metal gate metal from the second electrode material deposited later in step 1422.

The dielectric material deposited over the top surfaces and interior exposed surfaces of the semiconductor structure can be the same high-k dielectric material as the gate dielectric material under the metal gate material or it can be a different high-k dielectric material. The dielectric material deposited over and inside the semiconductor structure in step 1420 can have the same or a different thickness than the gate dielectric material under the metal gate material.

In step 1422, the method includes depositing a metal electrode material for the MIM capacitor. For example, using one of CVD, PVD, ALD, or electroplating, a second metal electrode material for the MIM capacitor is deposited inside the high-k dielectric material. The high-k dielectric material electrically isolates the second metal electrode material from the gate metal (e.g., the first electrode metal for the MIM capacitor). The metal electrode material can be any capacitor metal material such as but not limited to a metal nitride (TiN).

The metal electrode material deposited in the MIM capacitor opening and, in the area, previously containing the channel nanosheet layers creates a comb-like structure. The deposited metal electrode material has a central, vertical portion where the MIM opening is filled with metal electrode material. The metal electrode material also fills the thin, horizontal openings where the channel nanosheet layers were removed in step 1416. The metal electrode material is conformally deposited to fill the central, vertical portion of the MIM opening and to fill the flat, horizontal openings coated with the high-k dielectric material deposited in step 1420. The deposited metal electrode material forms the comb-like MIM capacitor structure with two sets of the thin, horizontal plate-like portions of the metal electrode material extending from the central, vertical portion of the metal electrode. Each set of the thin, horizontal portions of the metal electrode material extend outward from each side of the central, vertical portion of the metal electrode material. In other words, a set of teeth of the comb-like structure extend on one side of the central, vertical portion of the metal electrode material and another set of comb-teeth extend on the other side of the central, vertical portion of the metal electrode material. The central, vertical portion of the metal electrode material runs in the Y-Y direction depicted in FIG. 2B and the thin, horizontal portions of the metal electrode material filling the openings formed by the removal of the channel nanosheet layers are perpendicular to the central, vertical portion of the metal electrode.

The two sets of thin, horizontal portions of the metal electrode material that are insulated from the metal gate material forming another MIM capacitor electrode provide excellent capacitive properties and provide an improvement to the electrical performance of conventional MIM capacitors. The MIM capacitor structure is formed, in part, using the metal electrode material filling the MIM capacitor opening in the center of the capacitor and forming the thin, vertically stacked, horizontal portions of the areas previously filled by the channel nanosheet layers. In various embodiments, the metal electrode material is electrically isolated from the metal gate material by a dielectric material which may be a high-k dielectric material as the MIM capacitor insulator.

Providing the three-dimensional comb-like MIM capacitor structure with the set or stack of the thin, horizontal portions of the first metal electrode of the MIM capacitor and a central, vertical portion of the first metal electrode material improves MIM capacitor capabilities (e.g., improves Q factor of the MIM capacitor over conventional MIM capacitors). In various embodiments, the gate metal surrounds the first metal electrode material forming a second electrode for the MIM capacitor. As previously discussed, the first metal electrode is insulated from the gate metal (e.g., the second electrode) by a dielectric material which may be a high-k dielectric material, a single layer of a dielectric material, or composed of multiple layers of dielectric materials. As previously discussed, the gate metal may be a rectangular-shaped gate metal completely encasing the metal electrode material or may be a rectangular portion of the gate material that does not encase the outside edges of the horizontal plate-like portions of the metal electrode across the width of the rectangular gate metal.

Figure 21:
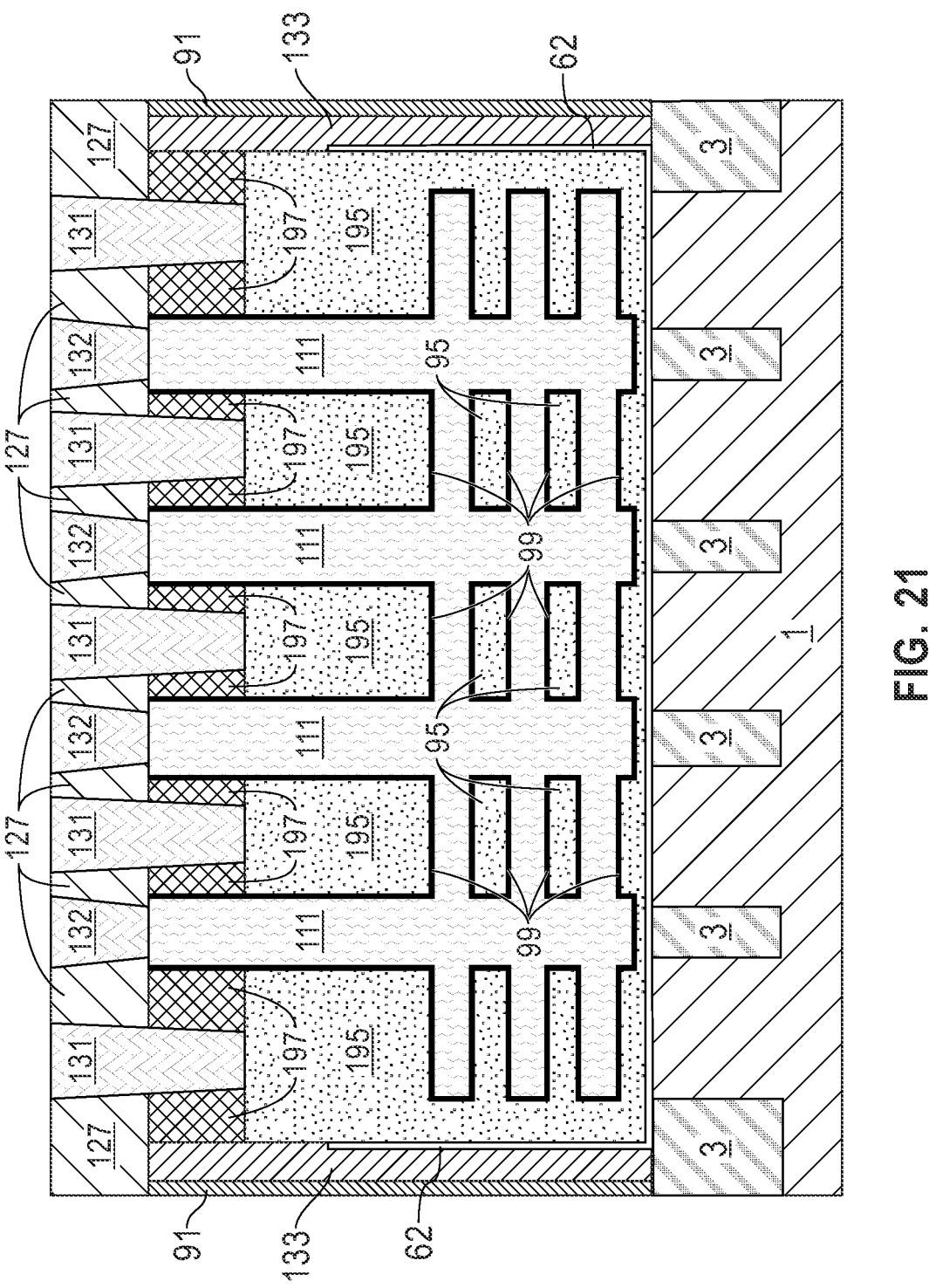
FIG. 21 depicts a cross-sectional view of the semiconductor structure in the Y-Y direction after completing the MIM capacitor and forming the MIM capacitor electrode contacts, in accordance with an embodiment of the present invention.

In step 1424, the method includes forming the MIM electrode contacts. Using known damascene processes for BEOL contact formation, electrode contacts can be formed. For example, an electrode contact can be formed connecting to the top surface of the central, vertical portion of metal electrode material. At least one electrode contact is formed connecting to the metal gate material above one of the sets of flat, horizontal portions of the metal electrode material. In some embodiments, two electrode contacts are formed connecting to the metal gate. In this case, each of the two electrode contacts that connect to the gate metal and are formed above one of the two sets of the flat, horizontal portions of the metal electrode material (e.g., as depicted in FIG. 12). In other examples, as depicted in FIG. 21, step 1424 includes forming multiple electrode contacts that each connect to either the gate metal or the metal electrode material.

FIG. 15 depicts a cross-sectional view of five nanosheet stacks, in accordance with another embodiment of the present invention. As depicted, FIG. 15 includes nanosheet stacks 151, 152, 153, 154, and 155 that are each on a portion of semiconductor substrate 1 with STIs 3 in semiconductor substrate 1 between each of the nanosheet stacks. Each of nanosheet stacks 151, 152, 153, 154, and 155 are formed using conventional nanosheet stack formation processes previously discussed with respect to FIG. 1. Each of nanosheet stacks 151, 152, 153, 154, and 155 can include alternating nanosheet layers of suspension material 16 and channel material 15 on semiconductor substrate 1. In other examples, the number of nanosheet stacks can be greater than 5 or less than 5. As known to one skilled in the art, the number alternating layers of channel material 15 and suspension material 16 can be different in other examples. Suspension material 16 is essentially the same as suspension material 4 and can be composed of SiGe but is not limited to this semiconductor material. Channel material 15 may be a silicon channel material but is not limited to this semiconductor material.

FIG. 16 depicts a top view of five nanosheet stacks after forming a sacrificial gate covered by hardmask 165, in accordance with an embodiment of the present invention. As depicted, FIG. 16 includes hardmask 165 that is over sacrificial gate 164 (not depicted in FIG. 16) on a center portion of each of nanosheet stacks 151, 152, 153, 154, and 155 with STI 3 between each of the nanosheet stacks. Spacer 133 abutting hardmask 165 and sacrificial gate 164 is not depicted in FIG. 16. The top layer of each nanosheet stacks 151, 152, 153, 154, and 155 is composed of suspension material 16. Hardmask 165 is essentially the same as hardmask 65. FIG. 16 illustrates a Y-Y direction parallel to hardmask 165 over sacrificial gate 164 that goes through a center portion of each nanosheet stack. Unless otherwise stated, the cross-sectional views are in the Y-Y direction. FIG. 16 illustrates an X-X direction that is perpendicular to the Y-Y direction and runs parallel to the length or long edge of each of the nanosheet stacks.

FIG. 17 depicts a cross-sectional view of the semiconductor structure in an X-X direction after forming sacrificial gate 164 covered by hardmask 165 and surrounded by spacer 133, in accordance with an embodiment of the present invention. As depicted, FIG. 17 includes hardmask 165, sacrificial gate 154, and spacer 133 on a top layer of suspension material 16 in a nanosheet stack of alternating layers of suspension material 16 and channel material 15 on semiconductor substrate 1. Spacer 133 does not extend to the edges of the top layer of suspension material 16 (e.g., leaves the outside edges of the nanosheet stack exposed).

Figure 18:
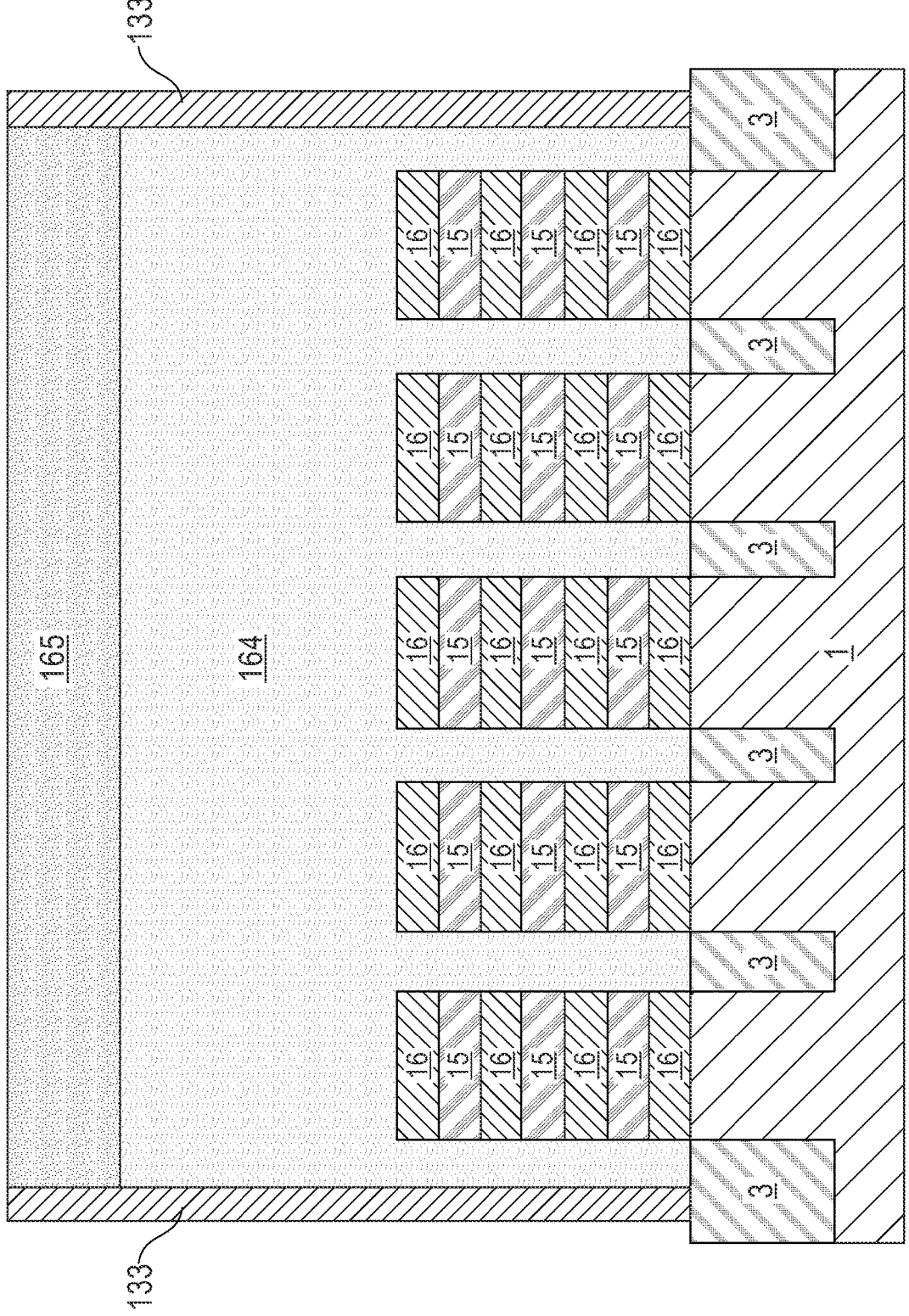
FIG. 18 depicts a cross-sectional view of the semiconductor structure in the Y-Y direction after forming a sacrificial gate covered by the hardmask and surrounded by a sidewall spacer on a nanosheet stack, in accordance with an embodiment of the present invention.

FIG. 18 depicts a cross-sectional view of the semiconductor structure in the Y-Y direction after forming a sacrificial gate covered by a hardmask and surrounded by a sidewall spacer on a nanosheet stack, in accordance with an embodiment of the present invention. As depicted, FIG. 18 includes the five nanosheet stacks composed of channel material 15 and suspension material 16, STIs 3, semiconductor substrate 1, sacrificial gate 164 above STIs 3 and the five nanosheet stacks, hardmask 165 on sacrificial gate 164, and spacer 133 surrounding hardmask 165 and sacrificial gate 164. Sacrificial gate 164 can be deposited by one of PVD, CVD, ALD, or a plating process. Hardmask 165 is deposited over sacrificial gate 164. Hardmask 165 is patterned and hardmask 165 and sacrificial gate 164 are etching using a directional etching process, such as RIE. Using known and previously discussed sidewall spacer formation processes, spacer 133 is formed abutting each side of sacrificial gate 164 and hardmask 165. Spacer 133 resides on STIs 3, as depicted. While the X-X direction for FIG. 18 is depicted on nanosheet stack 153 in FIG. 15, the semiconductor structure illustrated in FIG. 18 could be of any of nanosheet stack 151, 152, 153, 154, or 155.

FIG. 19 depicts a cross-sectional view of the semiconductor structure in the X-X direction after recessing suspension material 16 and depositing inner spacers, in accordance with an embodiment of the present invention. As depicted, FIG. 19 includes the elements of FIG. 17 with the outer edge portions of suspension material 16 removed and inner spacer 88 formed in their place. For example, using a lateral etching process (e.g., dry gas phase etch, etc.) the outer edges of suspension material 16 in the nanosheet stack forming a fin are removed. Using a conformal deposition process (e.g., ALD), inner spacers 88 are deposited between the outer edges of channel material 15 abutting the remaining portions of suspension material 15. Inner spacers 88 can be composed of SiN, SiBCN, an oxide material, another nitride material, or another suitable spacer material. An isotropic etching process, such as wet etch exposed portions of inner spacer 88. The portions of inner spacer 88 under spacer 133 and between outer edges of channel material 15 remain.

FIG. 20 depicts a cross-sectional view of the semiconductor structure in the X-X direction after replacing sacrificial gate 164 with metal gate material 195 and forming electrode contact 131, in accordance with an embodiment of the present invention. The MIM capacitor depicted in FIG. 20 is formed from the semiconductor structure depicted in FIG. 19 using the processes discussed in detail with respect to FIGS. 4-12 and steps 1406-1424 of FIG. 14. Metal gate material 195, metal electrode material 111, high-k dielectric 99, and gate dielectric 62 are essentially the same as metal gate material 63, metal material 83, dielectric material 72, and gate dielectric 62 but fill different shaped cavities due to the additional nanosheet stacks, inner spacers 88, and narrow sacrificial gate for MIM capacitor formation of the MIM capacitor depicted in FIGS. 20 and 21. Metal gate material 195 and metal electrode material 111 are MIM capacitor electrodes that are insulated from each other by high-k dielectric 99. Gate dielectric 62 surrounds a portion of the sides of metal gate material 195 and isolates the bottom portion of metal gate material 195 from semiconductor substrate 1.

Using known MOL or BEOL damascene processes, electrode contact 131 on metal gate material 195 is formed. As depicted, FIG. 20 includes electrode contact 131 on metal gate material 195, ILD 127, spacer 133, ILD 90, metal electrode material 111, gate dielectric 62, high-k dielectric 99, inner spacer 88, and semiconductor substrate 1. Contact 131 resides between a top portion of spacer 133 and in ILD 127. The X-X cross-section depicted in FIG. 20 is a cross-sectional perpendicular to the long direction of the MIM capacitor formed from a nanosheet stack and the sacrificial gate depicted in FIG. 16.

FIG. 21 depicts a cross-sectional view of the semiconductor structure in the Y-Y direction after forming contacts 131 and 132, in accordance with an embodiment of the present invention. The MIM capacitor depicted in FIG. 21 is formed from the semiconductor structure depicted in FIG. 19 using the processes discussed in detail with respect to FIGS. 4-12 and steps 1406-1424 of FIG. 14. As previously discussed, metal material 195, metal electrode material 111, high-k 99, and gate dielectric 62 are essentially the same as metal gate material 63, metal material 83, dielectric material 72, and gate dielectric 62 but fill different shaped cavities due to the additional nanosheet stacks, inner spacers 88, and narrow sacrificial gate for MIM capacitor formation of the MIM capacitor depicted in FIGS. 20 and 21.

Using known MOL or BEOL damascene processes previously discussed, contacts 131 on metal material 195 and contacts 132 residing on metal electrode material 111 can be formed. As depicted, FIG. 21 includes contacts 131, which may be considered top electrode contacts, on metal material 195, contacts 132, which may be considered bottom electrode contacts on metal material 11, ILD 127, spacer 133, high-k dielectric 99 around metal electrode material 111, gate dielectric 62 covering the bottom outside portion of metal material 195, ILD 90, inner spacer 88, and semiconductor substrate 1. Contact 131 resides between a top portion of spacer 133 and in ILD 127.

The MIM capacitor composed metal electrode material 111 electrically isolated from metal material 195 be high-k dielectric 99 with high-k dielectric remaining between the bottom portion of metal material 195 and spacer 133 resides above semiconductor substrate 1 with STIs 3. In various embodiments, the MIM capacitor depicted in FIG. 21 is created from five nanosheet stacks using the processes as discussed in detail with respect to FIG. 14 (e.g., depicted in FIGS. 1-12 and FIGS. 15-20). The MIM capacitor depicted in FIG. 21 includes four of contacts 132 connecting to a center of each metal electrode material 111 and five of contacts 131 connecting to metal material 195 however in other embodiments a different number of contacts 131 and 132 may be used (e.g., less or more of contacts 131 and/or contacts 132). FIG. 21 depicts four larger vertical portions of metal electrode material 111 connecting to the thin, horizontal portions of metal electrode material 111. Metal electrode material 111 is inside and electrically isolated from metal material 195 by high-k dielectric material 99 in the MIM capacitor of FIG. 21. As previously discussed, gate dielectric 62 and high-k dielectric 99 may be the same or different materials with the same and/or different thicknesses.

What is claimed is:

1. A metal-insulator-metal capacitor, the metal-insulator-metal capacitor comprising:
   a first electrode metal forming a central, vertical portion of the first electrode metal and two sets of stacked horizontal portions of the first electrode metal, wherein the central, vertical portion of the first electrode metal extends above a topmost horizontal portion of the two sets of stacked horizontal portions of the first electrode metal;
   an insulator material surrounding the first electrode metal and exposing a top surface of the central, vertical portion of the first electrode metal;
   a second electrode material surrounding the insulator material, wherein the insulator material comprises a same material as a gate dielectric material covering bottom and sidewall surfaces of the second electrode material;
   a first electrode contact connecting to the top surface of the central, vertical portion of the first electrode metal; and
   a second electrode contact connecting to a top surface of the second electrode material.

2. The metal-insulator-metal capacitor of claim 1, wherein the second electrode material is a gate electrode material forming a rectangular shape around the first electrode metal.

3. The metal-insulator-metal capacitor of claim 1, wherein the two sets of stacked horizontal portions of the first electrode metal extend on either side of the central, vertical portion of the first electrode metal.

4. The metal-insulator-metal capacitor of claim 1, wherein the insulator material surrounding the first electrode metal is a multilayer dielectric material.

5. The metal-insulator-metal capacitor of claim 1, wherein the insulator material surrounding the first electrode metal is a same material as a high-k dielectric material in one or more logic devices on a same semiconductor substrate.

6. The metal-insulator-metal capacitor of claim 1, wherein the gate dielectric material covering the sidewall surfaces of the second electrode material is located between a portion of a sidewall spacer and the second electrode material.

7. The metal-insulator-metal capacitor of claim 1, wherein the second electrode contact connecting to the top surface of the second electrode material connects to the top surface of the second electrode material above one of the two sets of stacked horizontal portions of the first electrode metal.

8. The metal-insulator-metal capacitor of claim 1, wherein the second electrode material encases the insulator material that is over the two sets of stacked horizontal portions of the first electrode metal.

9. The metal-insulator-metal capacitor of claim 1, wherein the two sets of stacked horizontal portions of the first electrode metal have outer edges that are each separated by an inner spacer.

10. The metal-insulator-metal capacitor of claim 1, wherein the two sets of stacked horizontal portions of the first electrode metal inside the insulator material form a comb-like metal-insulator-metal capacitor structure.

11. A metal-insulator-metal capacitor, the metal-insulator-metal capacitor comprising:

a first electrode metal forming multiple central, vertical portions of the first electrode metal and multiple sets of stacked horizontal portions of the first electrode metal, wherein the multiple central, vertical portions of the first electrode metal extend above a topmost horizontal portion of the multiple sets of stacked horizontal portions of the first electrode metal;

an insulator material surrounding the first electrode metal and exposing a top surface of each of the central, vertical portions of the first electrode metal;

a second electrode material surrounding the insulator material, wherein the insulator material comprises a same material as a gate dielectric material covering bottom and sidewall surfaces of the second electrode material;

a first electrode contact connecting to each of the top surface of the multiple central, vertical portions of the first electrode metal; and a second electrode contact connecting to a top surface of the second electrode material on either side of each of the multiple central, vertical portions of the first electrode metal.

12. The metal-insulator-metal capacitor of claim 11, wherein the second electrode material covers a center portion of each of the multiple sets of stacked horizontal portions of the first electrode metal.

13. The metal-insulator-metal capacitor of claim 12, wherein each of the multiple sets of stacked horizontal portions of the first electrode metal include an inner spacer between outer edges of each layer of the first electrode metal in the multiple sets of stacked horizontal portions of the first electrode metal.

14. The metal-insulator-metal capacitor of claim 11, wherein the insulator surrounding the first electrode metal is formed simultaneously with a gate dielectric material in one or more logic devices in a different region of a same semiconductor substrate.

15. A method of forming a metal-insulator-metal capacitor with a comb-like structure, the method comprising:

forming, from a first electrode metal, a central, vertical portion of the first electrode metal and two sets of stacked horizontal portions of the first electrode metal, wherein the central, vertical portion of the first electrode metal extends above a topmost horizontal portion of the two sets of stacked horizontal portions of the first electrode metal;

depositing an insulator material, the insulator material surrounding the first electrode material and exposing a top surface of the central, vertical portion of the first electrode metal;

depositing a second electrode material, the second electrode material surrounding the insulator material, wherein the insulator material comprises a same material as a gate dielectric material covering bottom and sidewall surfaces of the second electrode material;

forming a first electrode contact on a top surface of the central, vertical portion of the first electrode metal; and forming a second electrode contact to a top surface of the second electrode.

16. The method of claim 15, further comprising forming a sidewall spacer on vertical sides of the gate dielectric material.

17. The method of claim 16, wherein the insulator material surrounding the first electrode is formed simultaneously with the gate dielectric material in one or more logic devices of a same semiconductor substrate.

18. The method of claim 15, wherein the insulator material surrounding the first electrode metal comprises a multilayer dielectric material.

19. The method of claim 18, wherein the multilayer dielectric material includes at least one layer of a high-k dielectric material.

\*    \*    \*    \*    \*